(12) United States Patent (10) Patent No.: US 7,987,086 B2
Van Huben et al. (45) Date of Patent: Jul. 26, 2011

(54) SOFTWARE ENTITY FOR THE CREATION OF A HYBRID CYCLE SIMULATION MODEL

(75) Inventors: Gary A. Van Huben, Poughkeepsie, NY (US); Edward J. Kamindki, Jr., Wynnewood, PA (US); Elspeth Anne Huston, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 12/248,951

(22) Filed: Oct. 10, 2008

(65) Prior Publication Data

US 2009/0030666 A1 Jan. 29, 2009

Related U.S. Application Data

(63) Continuation of application No. 11/225,689, filed on Sep. 12, 2005, now Pat. No. 7,483,825.

(51) Int. Cl.
*G06F 17/50* (2006.01)
*G06F 9/44* (2006.01)

(52) U.S. Cl. .............. 703/16; 703/22; 703/23; 716/106; 717/131

(58) Field of Classification Search .................... 703/16, 703/22, 23; 716/106; 717/131
See application file for complete search history.

(56) References Cited

U.S. PATENT DOCUMENTS

| 6,240,376 B1 | 5/2001 | Raynaud et al. |
|---|---|---|
| 6,336,087 B2 | 1/2002 | Burgun et al. |
| 6,523,155 B1 | 2/2003 | Ruedinger |
| 6,604,065 B1 | 8/2003 | Blomgren et al. |
| 6,842,728 B2 | 1/2005 | Gooding et al. |
| 7,305,635 B1 | 12/2007 | Abramovici et al. |
| 2003/0046668 A1 | 3/2003 | Bowen |

*Primary Examiner* — Thai Phan
(74) *Attorney, Agent, or Firm* — John E. Campbell; Lynn L. Augspurger

(57) ABSTRACT

Disclosed is a software entity for constructing a Hybrid Cycle Simulation model comprising Compiled Data Units (CDUs) for use in design verification. The simulation model may contain a plurality of 1-cycle CDUs, optimized for simulation throughput, and 2-cycle CDUs, optimized for simulation accuracy, or a mixture thereof. Utilizing a netlist tool extracting hierarchical design source components for use, the construction checks that all inputs and outputs of any hierarchical design source components bind, and employs Object Traversal Directives for incorporating the selected CDUs into the simulation model. A data management method is used for tracking the validity of the components in the model. Additionally, a software entity (FACDDR) permits high bandwidth simulation of design components normally requiring cycle accurate simulation. FACDDR provides linkages for standard logic elements for abstracting one or more design interface components out of a cycle simulation environment and design interface emulation of an interface which interacts with a cycle simulation model through an API to extract present value of driving side signals of an interface and to set the cycle simulation model on the receiving side.

7 Claims, 18 Drawing Sheets

| DESIGN SOURCE | 1-CYCLE MODEL | 2-CYCLE MODEL | HYBRID MODEL |
|---|---|---|---|
| RANDOM LOGIC MACROS | RTL VHDL | GATE LEVEL DESIGN | RTL VHDL |
| CLOCKS | BEHAVIORAL VHDL | GATE LEVEL DESIGN | BEHAVIORAL VHDL |
| E.I. I/O BLOCKS | EPH | GATE LEVEL DESIGN | GATE LEVEL DESIGN |

31

| SIM MODEL SIZE COMPARISON | 2-CYCLE | HYBRID | DELTA |
|---|---|---|---|
| MODEL SIZE (GB) | 40,525,957 | 27,931,134 | 31% |
| # PRIMITIVES | 16,285,467 | 10,605,258 | 34% |
| # LATCHES | 5,228,827 | 2,225,732 | 57% |

51

| SIM MODEL PERF | RAW SPEED | DELTA |
|---|---|---|
| 1-CYCLE | 42 Cyc/S | 4.94X |
| HYBRID | 14 Cyc/S | 1.65X |
| 2-CYCLE | 8.5 Cyc/S | BASELINE |

SOFTWARE ENTITY FOR THE CREATION OF A HYBRID CYCLE SIMULATION MODEL

RELATED APPLICATION

This application is a continuing application of application Ser. No. 11/225,689 filed Sep. 12, 2005, now U.S. Pat. No. 7,483,825.

TRADEMARKS

IBM® is a registered trademark of International Business Machines Corporation, Armonk, N.Y., U.S.A. Other names used herein may be registered trademarks, trademarks or product names of International Business Machines Corporation or other companies.

SECTION 1.01 BACKGROUND OF THE INVENTION

1. Field of the Invention

This invention relates to the field of computer hardware design verification, specifically in the area of cycle simulation. Disclosed herein is a software entity and method for constructing a Hybrid Cycle Simulation model comprised of a mixture of Compiled Data Units (CDUs). Said simulation model may contain a plurality of 1-cycle CDUs, optimized for simulation throughput, and 2-cycle CDUs, optimized for simulation accuracy. Additionally, the present invention contemplates the software entity named FACDDR which implements a method to permit high bandwidth simulation of design components normally requiring cycle accurate simulation as a software entity.

2. Description of Background

There have been many improvements in the area of hardware design verification and cycle simulation necessitated by the ever increasing complexity of integrated circuit designs at IBM. This increased complexity translates to substantial development and manufacturing expense, which is directly proportional to the number of design fabrication iterations. One approach to controlling these costs is to perform robust verification through cycle simulation. Prior to our invention, there existed the use of cycle simulation where the evaluation is only performed on the clock boundaries instead of every unit of clock time. The advantage of cycle simulation is the tremendous performance boost compared to traditional event based simulation. The cycle simulation models can be modeled in 2 different ways. These are commonly referred to as a single cycle simulation model (hereafter referred to as 1-cycle simulation) or a two-cycle (2-cycle) simulation model.

A single cycle simulation model makes a single evaluation of the latches per machine cycle. This results in a faster simulation because the latches are only evaluated at the L2 boundary. The L1 latches are treated as wires. Since simulation performance is also directly related to model size, it is often desirable to eliminate portions of the design that can't benefit from single cycle simulation. For example, functions like clocking, phased lock loops and Built-In Self Test (BIST) can rarely be effectively validated in a 1-cycle simulation environment. Instead, the single cycle simulation model is used for the majority of main line function because it is sufficient for testing typical machine operations.

The benefits of single cycle simulation include smaller model size and faster simulation throughput. Smaller model size is particularly important on hardware simulators with limited capacity and resulting in smaller event traces for problem debug. Faster throughput allows for flushing through problems faster using fewer workstations to produce the same number of simulation clocks. The disadvantage is that behavioral "black boxes" are required to represent some parts of the design, such as the aforementioned functions.

A two cycle simulation model makes two simulation evaluations of the latches per machine cycle. The latches are divided into L1 and L2 latches such that the L1 latches are evaluated on the rising edge of the global system clock and the L2 latches are evaluated on the falling edge of the global system clock. This allows for the modeling of certain test functions such as machine initialization via scanning. One major advantage of the 2-cycle model is the modeling of pervasive functions like clocking, scanning, I/O, array verification, firmware validation and BIST logic. While significantly faster than an event simulation, the 2-cycle simulation has slower performance than a 1-cycle simulation and is larger in size. Additional information on the advantages of cycle simulation and the differences between 1-cycle and 2-cycle simulation can be found in the IBM Journal of Research and Development Volume 41, Number 4/5, dated July/September 1.

Although many inventions in the related art field solve many of the problems and shortcomings faced by hardware designers, they fail to address several aspects of the present invention. For example:

U.S. Pat. No. 6,240,376 entitled Method and Apparatus for Gate Level Simulation of Synthesized Register Transfer Level Designs with Source Level Debugging, issued to Raymond et al., provides a method to cross reference a gate level netlist with register transfer language source for purposes of interactive debug and source code simulation coverage.

U.S. Pat. No. 5,696,942 entitled Cycle Based Event Driven Simulator for Hardware Designs, issued to Palnitkar et al., describes a means of efficiently ordering and evaluating logic transitional events in a cycle simulation environment.

U.S. Pat. No. 6,604,065 entitled Multiple State Simulation for Non-Binary Logic, issued to Blomgren et al. teaches a method for efficiently simulating hardware designs that entail the use of non-binary logic levels.

U.S. Pat. No. 6,842,728 entitled Time Multiplexing Data Between Asynchronous Clock Domains Within Cycle Simulation and Emulation Environments, issued to Gooding et al., illustrates an apparatus which permits a hardware design comprised of a plurality of different frequency domains to efficiently transfer signals between them in a hardware emulator.

U.S. Pat. No. 6,625,572 entitled Cycle Modeling in Cycle Accurate Software Simulators of Hardware Modules for Software/Software Cross Simulation and Hardware/Software Co-simulation, issued to Zemlyak et al., provides a method of modeling a processor in a cycle simulation environment through the use of software to permit co-simulation between a multitude of software and hardware entities.

Finally, U.S. Pat. No. 6,523,155 entitled Method for Partitioning a Netlist into Multiple Clock Domains, issued to Ruedinger, describes a means of automatically partitioning a hardware design netlist comprised of a plurality of clock domains, into multiple domains for purposes of parallel cycle or event based simulation.

While the aforementioned inventions are considered innovative in the area of hardware design verification, none of them, either individually, or taken in combination, address the need to balance simulation performance throughput against behavioral accuracy in a cycle simulation environment. However, one skilled in the art may appreciate how several of the prior art inventions would complement, and incorporate into, our invention.

SECTION 1.02 SUMMARY OF THE INVENTION

This invention describes a method for creating a hybrid cycle simulation logic model for use in logic verification, which allows for balancing model size and speed against the level of accuracy in the modeling of the logic components. Speed and model size improvements can be realized through omission of unnecessary logic components and through the use of 1-cycle representations where L1-L2 latches are modeled as L2-only latches. Accuracy is greater for some components when a 2-cycle representation comprising both L1 and L2 latches is used. The ability to select the latch representation of each component is achieved during the model build process, through the use of Object Traversal Directives that work in conjunction with a data management system used to store the logic design source code. Special considerations may be needed for clocking the mixed model components and for components that cannot function properly as a 1-cycle representation. Gains in size and speed for 1-cycle abstractions over 2-cycle abstractions will be dependent on the cycle simulator used and the internal structures and optimizations employed by the simulator.

In general, 1-cycle representations can provide speed and size advantages over a more logically accurate 2-cycle representation for components where there is no logic between the L1 and L2 latches, and the L1 latch output is not used to feed other logic. This is due to the fact that an L2-only latch consumes half the space (or less) of that needed to represent an L1-L2 latch in a cycle simulator. Some logic components cannot be abstracted to representation by L2-only latches, but it may be desirable to verify the operation of these components in concert with the vast majority of logic which can be abstracted. Rather than expend the performance and size penalty for using a model of solely non-abstracted components, it is possible to construct a hybrid model which is a mix of the non-abstracted components and abstracted components. Further, it may be beneficial to entirely omit logic for some components where they are not required for the verification of some subset of function, or are slated be replaced with an alternate behavior. This behavior is often provided by an external source working through an API into the cycle simulator or written in a hardware design language.

A data management system for logic design source code is disclosed which enables the use of Object Traversal Directives for selecting logic representations during the model build process, as well as providing a means of tracking said logic components from which the verification model is built. These directives typically select representations throughout the hierarchy that range from placeholders, containing interface-only descriptions and no underlying logic, to post synthesis 2-cycle representations. The ability to accurately track which representations are present in the model is important in determining that all logic components are being properly verified.

Mixing 2-cycle and 1-cycle representations may require some special handing for clocking and logic components which cannot be abstracted to 1-cycle representations. The clock for 1-cycle components is of a different shape than the clock used by 2-cycle components because there is no L1 bypass provided by the L2-only abstraction. Another case requiring special handling is when the goal is to run the majority of the components as 1-cycle representations with the L2-only latches being clocked in a cycle simulator on every simulation cycle. In this environment, some logic components will not function properly as abstractions either because they have intervening logic between the L1 and L2 latches, or use the output of the L1 latch to feed downstream logic.

Also described herein is an I/O block using a Source Synchronous Interface (sometimes referred to as an Elastic Interface) which transmits at a double-data rate with respect to the logic it interfaces with, by utilizing the rising and falling edges of the clocks. The I/O block uses the output from the L1 and L2 portions of its L1-L2 latches so it cannot be easily abstracted to an L2-only representation. Thus, the I/O block either requires the use of a 2-cycle representation or a substitute alternate behavior. In our preferred embodiment, it is necessary to verify a hardware initialization sequence which consumes substantial simulation cycles. For purposes of simulation performance, it is desirable for the model to be abstracted to a 1-cycle representation such that the L2-only latches are updated on every simulation cycle. However, an alternate behavioral representation of the Elastic Interface through the use of a hardware description language is not feasible, since the hardware design language representation cannot be clocked twice as fast as the abstracted logic. Our invention offers an innovative and efficient C++ solution software entity known as FACDDR which is described in the drawings from which one skilled in the art can implement code in C++ which is then deliverable on standard CDs as a tangible embodiment, which interacts through the cycle simulation API.

Given that the 1-cycle and the 2-cycle simulation models each provide specific benefits, it is desirable to create a simulation environment that would simultaneously incorporate a two cycle model, where required, along with a single cycle model where able. This type of hybrid simulation environment offers the combined advantage of both a performance boost and the required functionality for simulation. In the preferred embodiment, we chose to simulate the elastic interface as a two cycle model since its latches respond to both the rising and falling edges of the system clock. Described herein is the technique used to derive such a hybrid model. One skilled in the art will appreciate the global applicability of the present invention to any situation where mixed single and two cycle simulation modeling would be beneficial.

Additional features and advantages are realized through the techniques of the present invention. Other embodiments and aspects of the invention are described in detail herein and are considered a part of the claimed invention. For a better understanding of the invention with advantages and features, refer to the description and to the drawings.

SECTION 1.03 BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 4A:
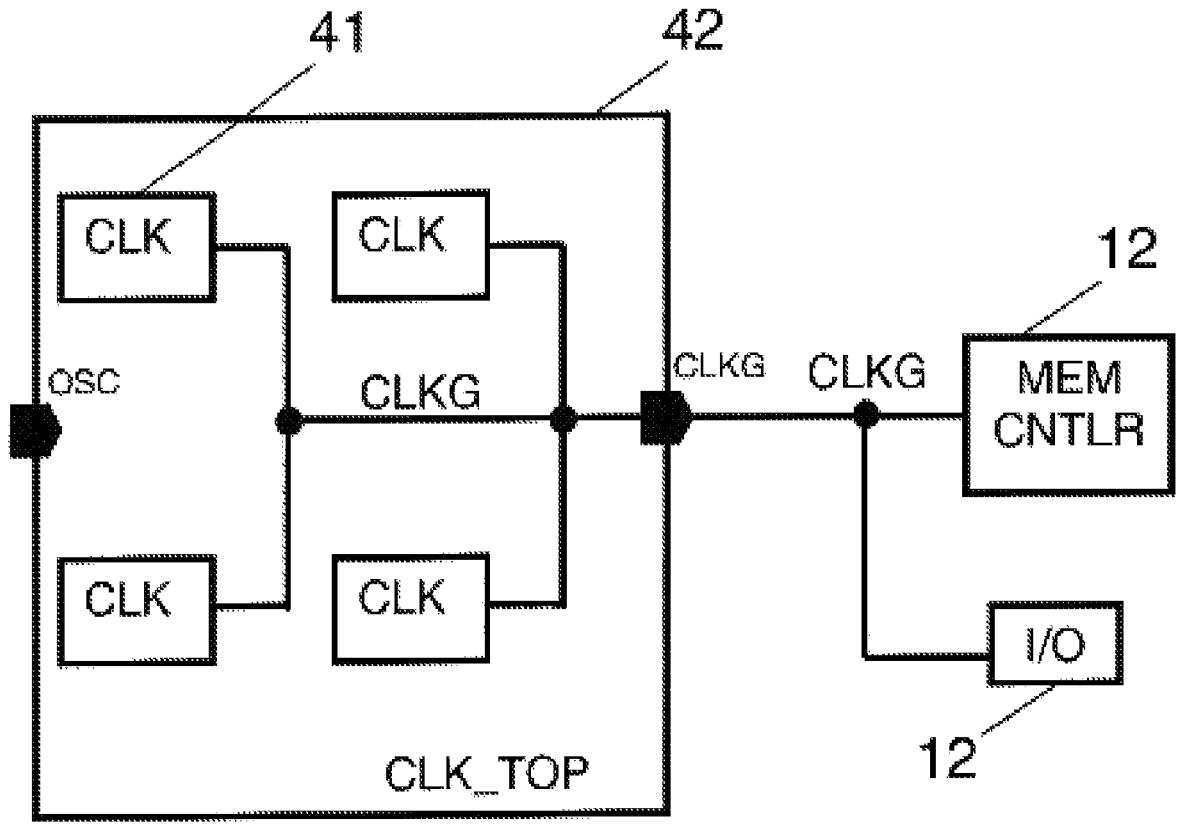
FIG. 4A shows a typical clocking infrastructure for an example computer system and demonstrates the distribution of the clocks to the downstream design components.
Figure 4B:
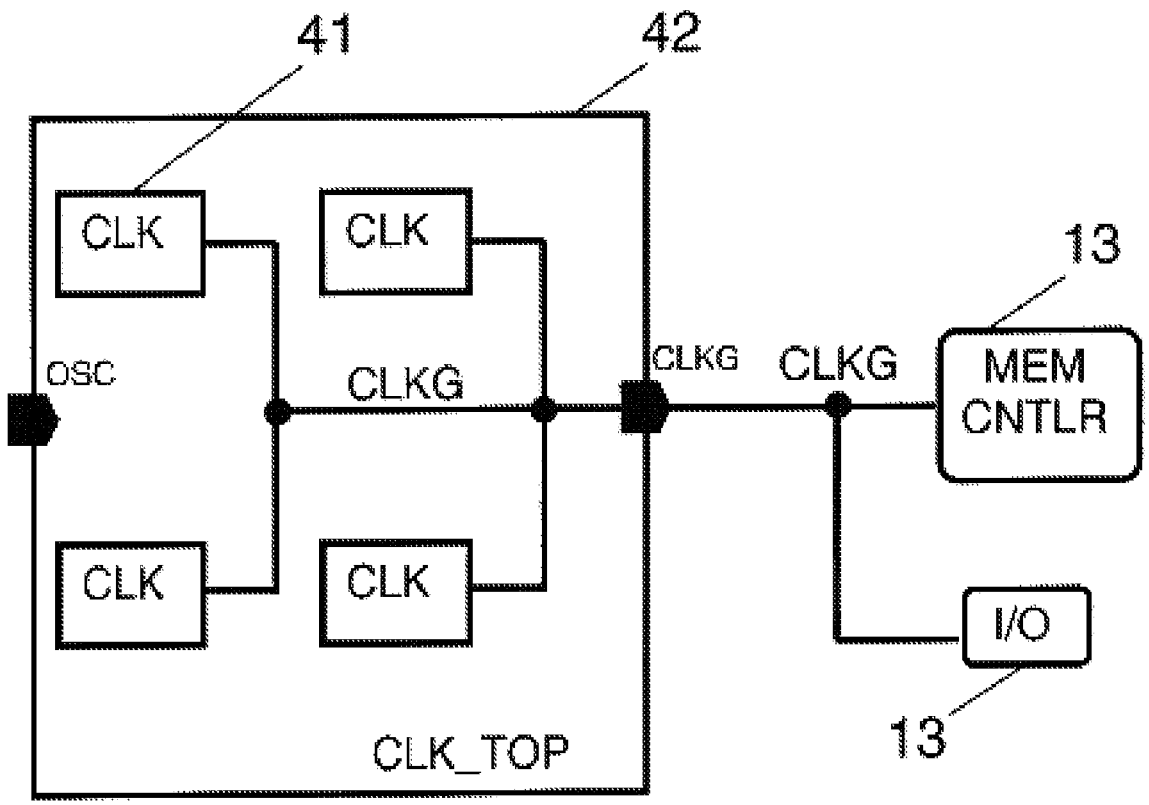
FIG. 4B depicts the same clocking infrastructure as FIG. 4A, but in this case, the clocks interact with 2-cycle CDU representations of the design components.
Figure 4C:
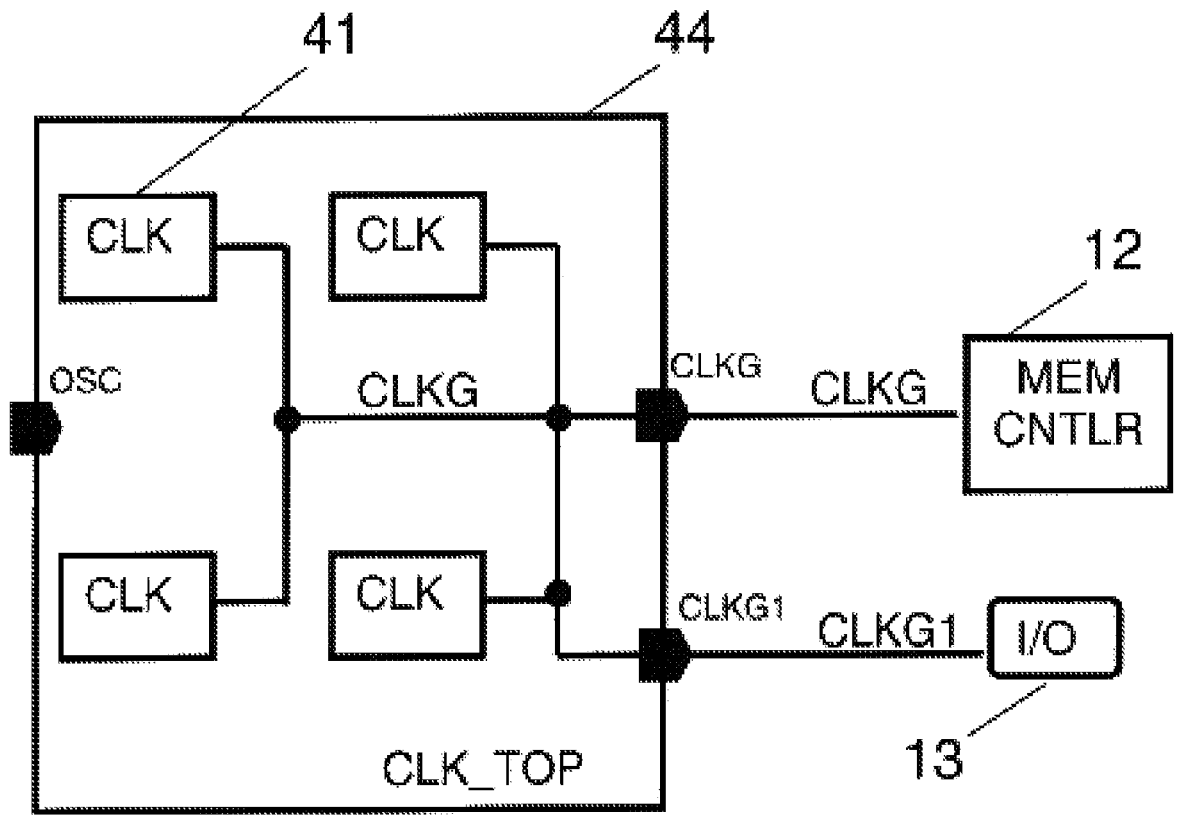

FIG. 4C demonstrates an approach to permit a mixture of 1-cycle and 2-cycle CDUs to coexist in a Hybrid Cycle Simulation Model, and yet allow independent clock control of the different CDUs.

FIG. 5 shows in tabular form the improvements gained by the preferred embodiment of the present invention in both simulation model size and performance.

Figure 6:
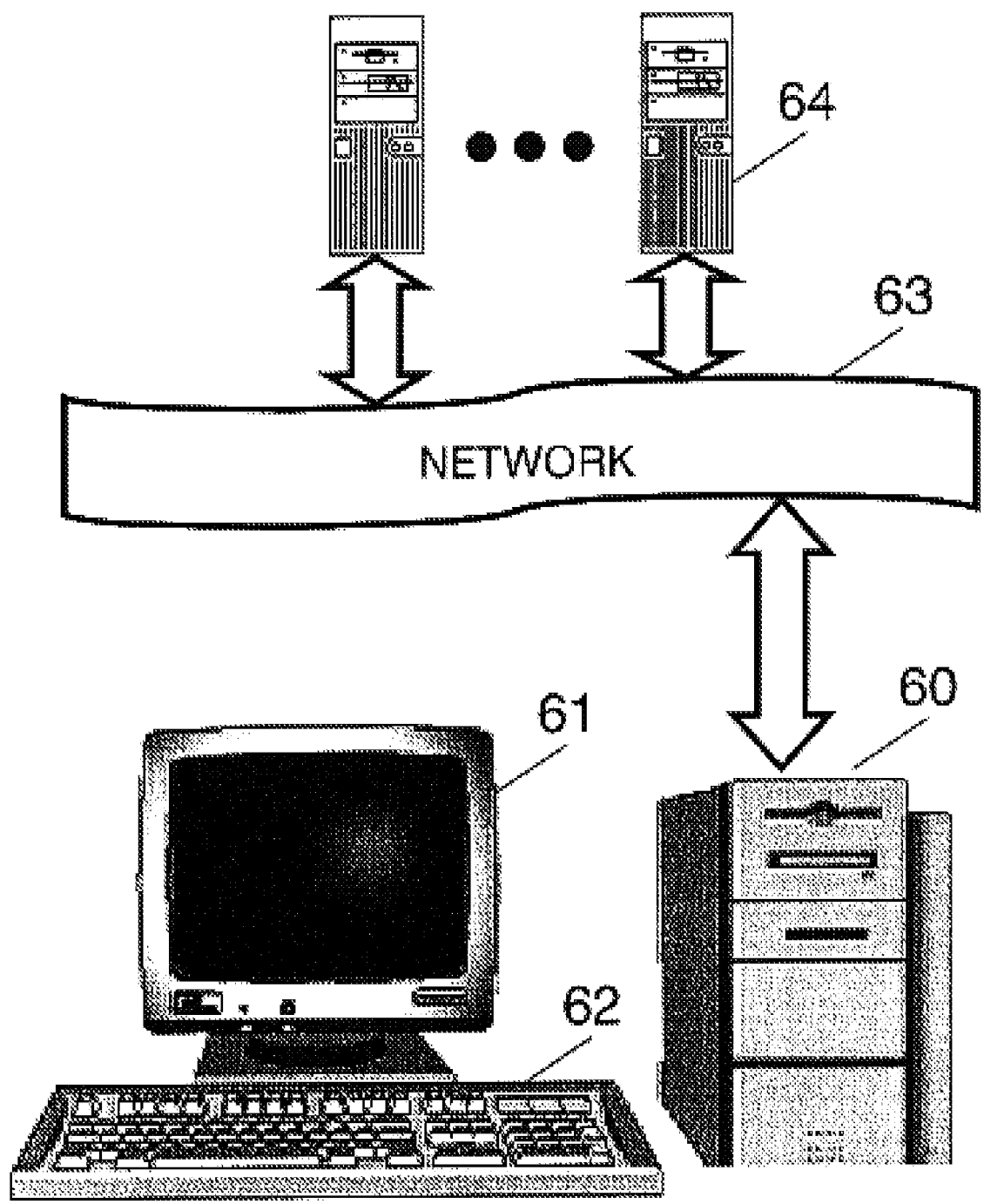

FIG. 6 depicts a standard simulation workstation comprising tangible media upon which the FACDDR software entity may be executed in accordance with the present invention.

Figure 7A:
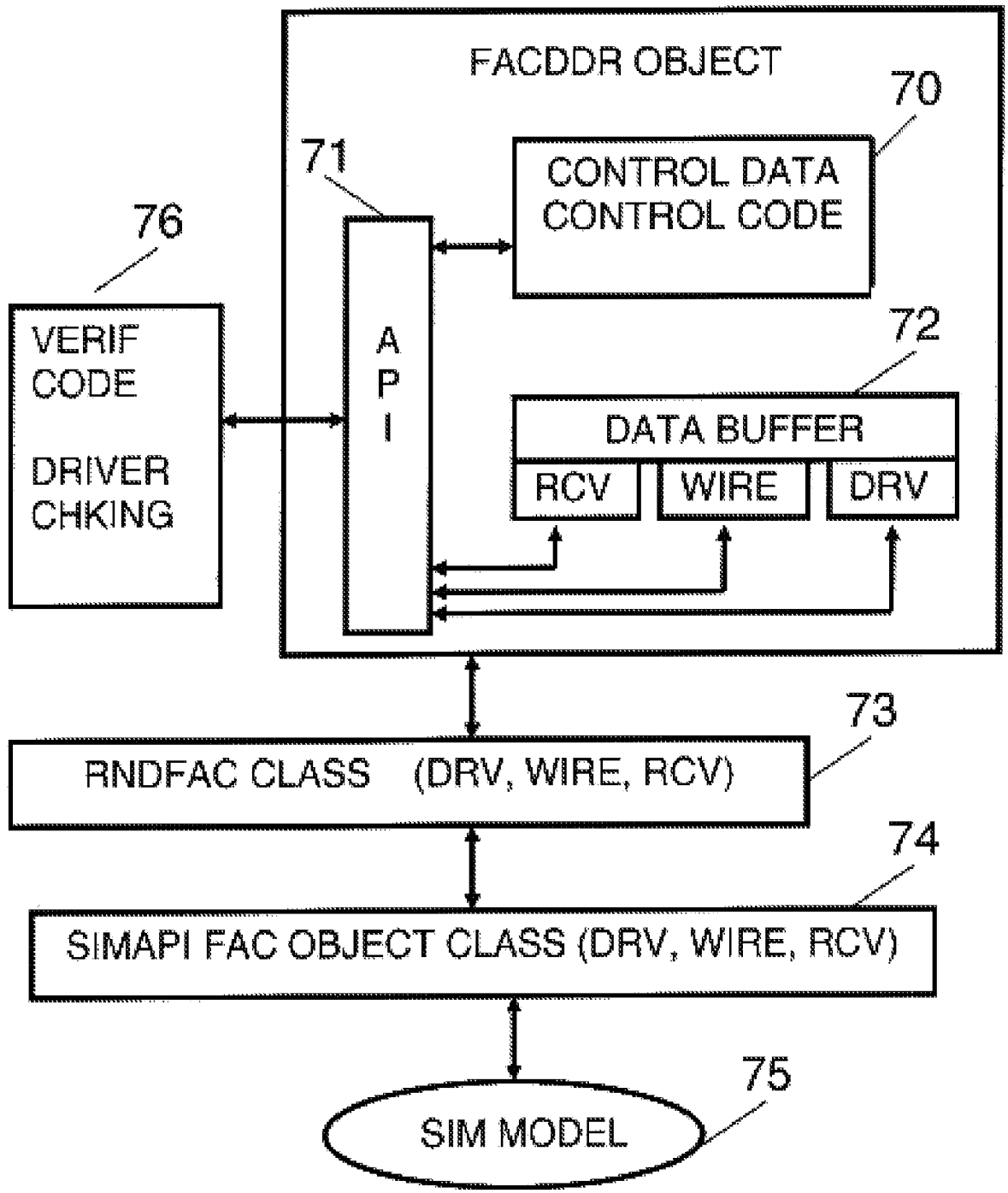
Figure 7B:
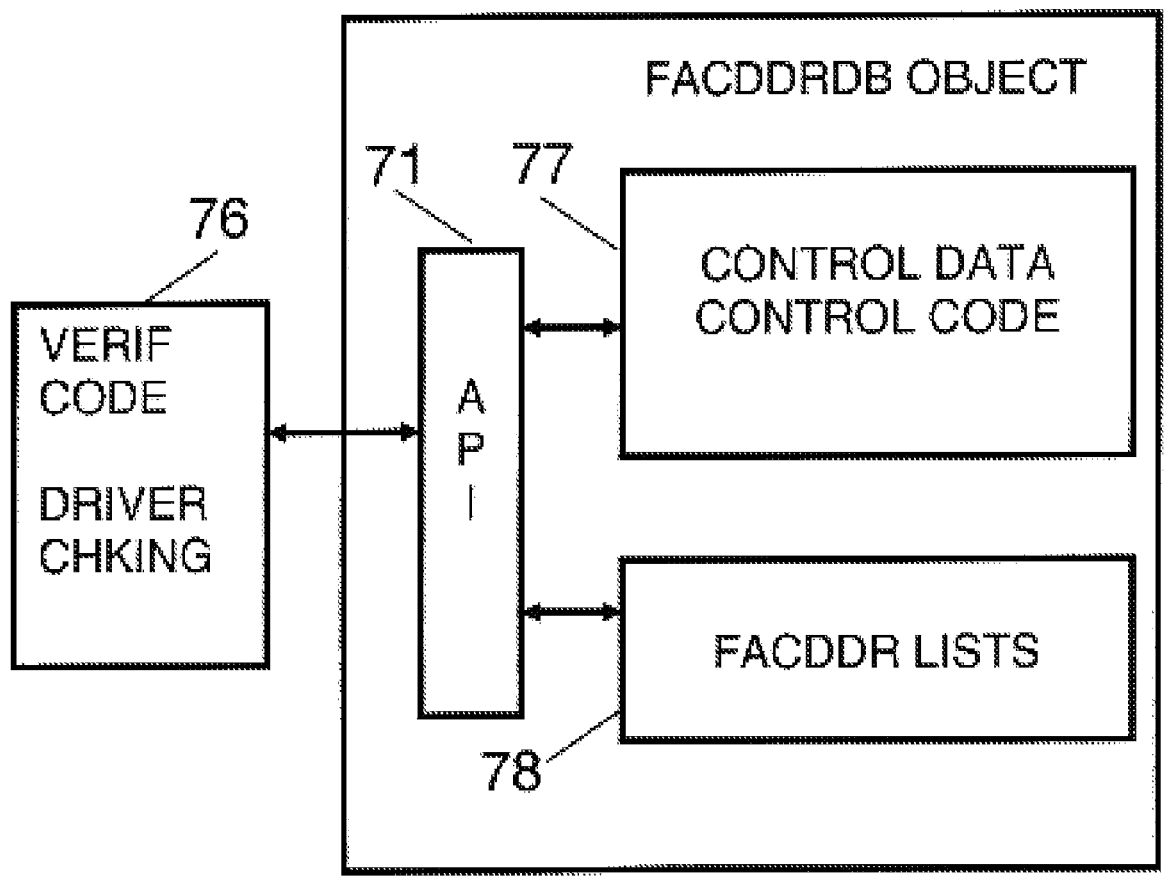

FIGS. 7A and 7B illustrates the architectural elements comprising the FACDDR software entity.

Figure 8:
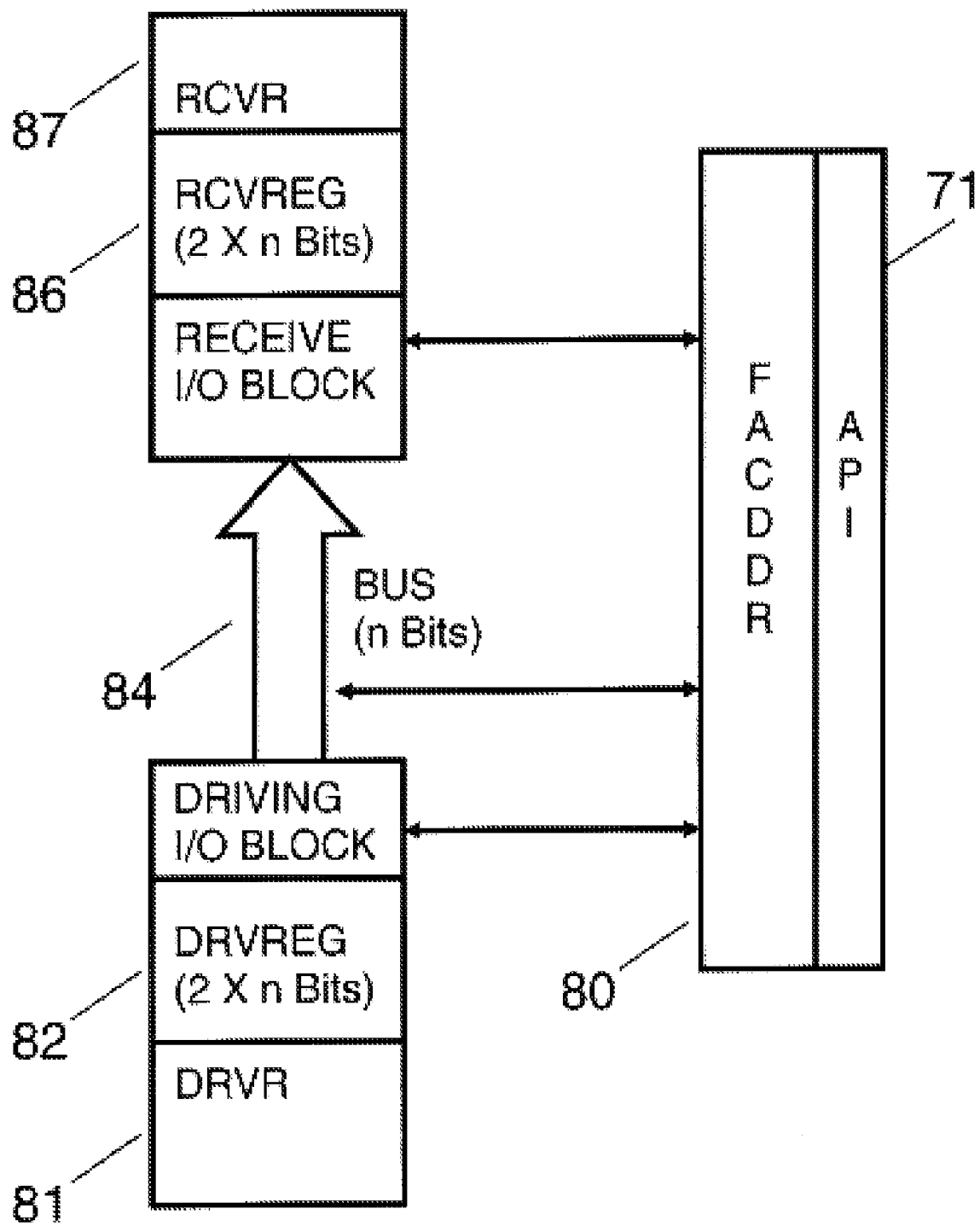

FIG. 8 depicts the FACDDR facility along with its underlying components that intervene between the design under test and the simulation environment.

The detailed description explains the preferred embodiments of the invention, together with advantages and features, by way of example with reference to the drawings.

SECTION 1.04 DETAILED DESCRIPTION OF THE INVENTION

Figure 1A:
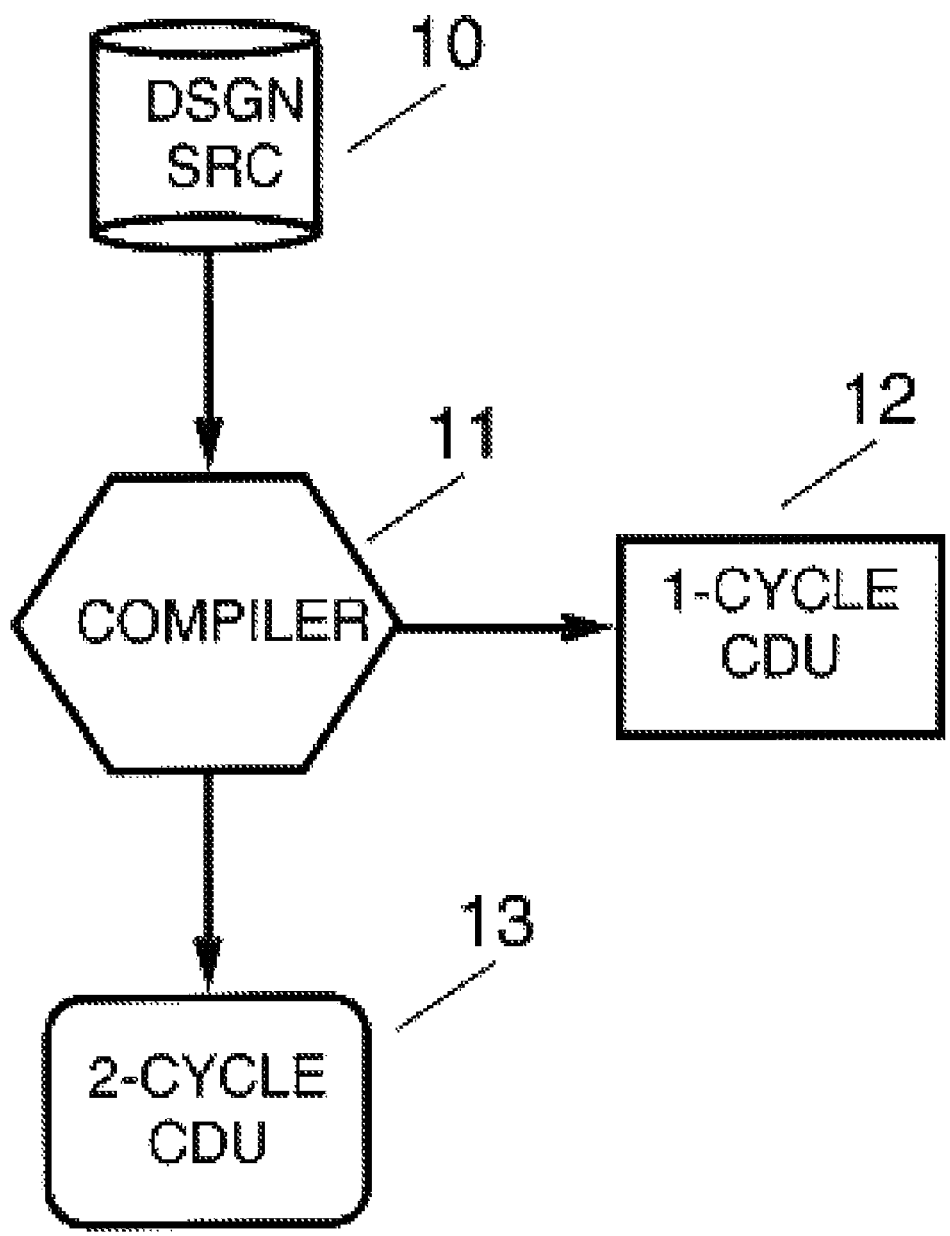
FIG. 1A illustrates a flowchart for compiling I-Cycle and 2-Cycle Compiled Data Units (CDUs).

Turning now to the drawings in greater detail, it will be seen that FIG. 1A depicts a flowchart comprising the steps for building a plurality of compiled data units (hereafter referred to as CDUs) which represent the critical component of a hybrid cycle simulation model build process. The preferred embodiment enables the cycle simulation models to be constructed using 1-cycle (also known as single cycle) CDUs, 2-cycle CDUs or a combination thereof.

As seen in FIG. 1A, the Design Source (10) is fed into a Compiler (11). In our preferred embodiment, the Design Source is represented by the VHDL hardware description language wherein said Design Source (10) is described at the register transfer level (RTL). One skilled in the art can appreciate that the present invention is applicable to alternate design source descriptions, such as, but not limited to, Verilog, JHDL and the like. The Compiler (11) step in FIG. 1A represents any hardware description language compiler used to decompose the register transfer level design source into a set of primitive building blocks. These building blocks comprise the basic functions of digital logic design such as AND gates, OR gates, signal assignments and basic latch constructs. The compiler may output technology independent primitives which can provide a more optimized and higher performing simulation model or the compiler can map the RTL design source into a set of primitives associated with a particular chip fabrication technology such as IBM's CMOS10S design library.

Our invention is unique in that it provides a means for the Compiler (11) to produce either 1-cycle CDUs (12) or 2-cycle CDUs (13) for the same simulation model. Historically, simulation model CDUs are fixed based on the intent of the model. For example, if the model is going to be used purely for behavioral or architectural verification, then the compiler associated with that model produces a complete set of 1-cycle CDUs (12) for the plurality of Design Source (10). On the other hand, if the intent of the model is to perform functional verification of a technology specific gate level design, then the Compiler (11) would remap the entire plurality of Design Source (10) to 2-cycle CDUs (13) wherein the underlying primitive building blocks have correspondence to the target technology library. The preferred embodiment of the present invention supports either method of homogenous simulation model builds while also introducing the novel concept of a mixed, or hybrid, model build.

Figure 1B:
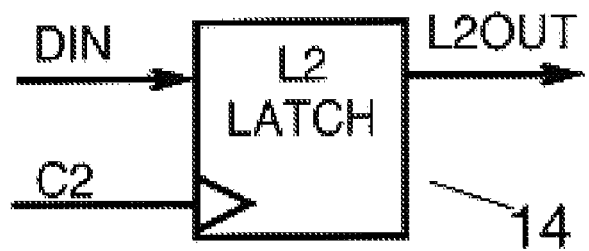
FIG. 1B depicts a generic latch component contained in a 1-cycle Compiled Data Unit (CDU).
Figure 1B:
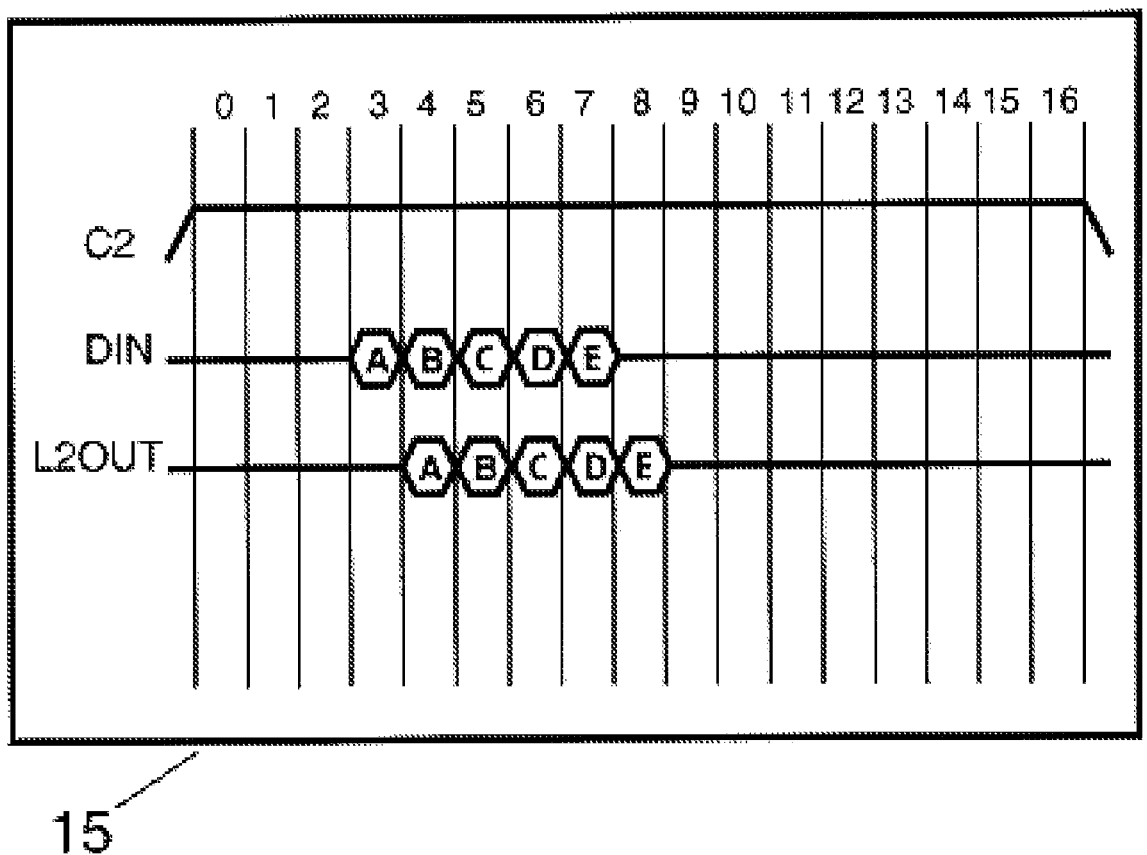
Figure 1C:
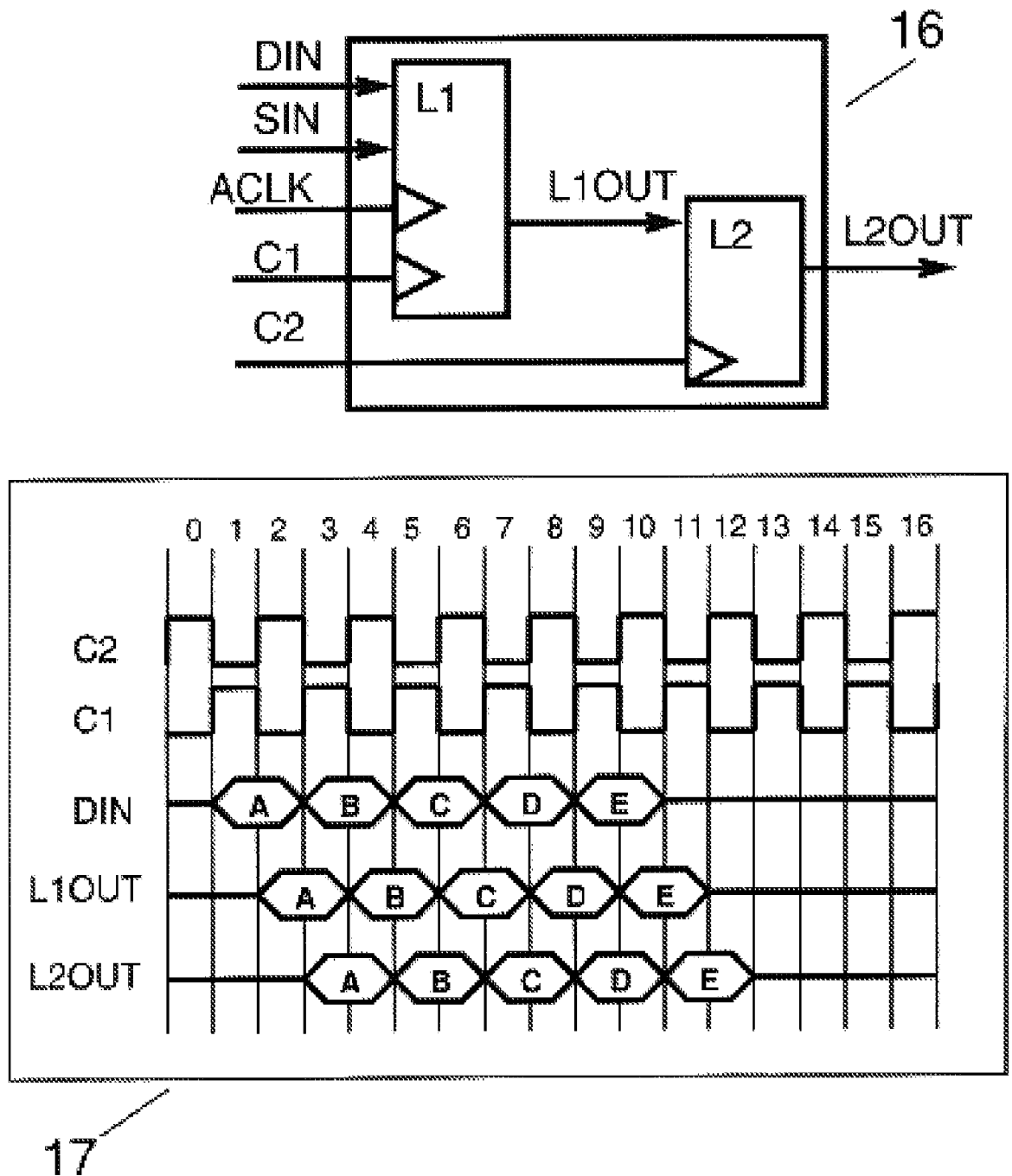
FIG. 1C depicts a generic latch component contained in a 2-cycle Compiled Data Unit (CDU).

FIGS. 1B and 1C serve to illustrate the primary difference between the 1-cycle (12) and 2-cycle (13) CDUs produced by the Compiler (11) in FIG. 1A. In a cycle simulation model, all non-clocked Boolean logic constructs (ANDs, ORs, signal assignments, etc.) are evaluated once during each simulation cycle. Each simulation cycle does not necessarily correspond to an actual hardware clock cycle. The relationship between hardware and simulation clocking depends on a number of factors including how the simulation model is built, the design itself and how the verification environment is set up to drive the hardware under test. In any event, the logic primitives in either the 1-cycle (12) or 2-cycle (13) CDUs will be evaluated during each simulation cycle.

In our preferred embodiment, the latch primitives behave differently depending on whether the Compiler (11) is directed to build them as 1-cycle CDUs (12) or 2-cycle CDUs (13). The 1-cycle Latch Primitive (14) is shown in FIG. 1B as a very simple structure comprising a data input (DIN) pin, a data output (L2OUT) pin and a single clock (C2). The behavior of the latch is modeled such that the latch will update the present state with the value of DIN only when the C2 clock is active, otherwise the present state will retain the previous state. The timing diagram (15) at the bottom of FIG. 1B illustrates this behavior. In the depicted scenario, the latch clock (C2) is active during every simulation cycle. This permits the cycle simulator to update the value of the latch every cycle. In Cycle 3, a stream of data appears at the data input (DIN) with a first data packet "A". This data packet is followed on the four subsequent cycles by data packets "B" thru "E". As shown in the diagram, since latch clock (C2) is active, the present state of the latch is updated on the simulation cycle following the data's appearance at the latch input. So data packet "A" is stored into the latch on Cycle 4, where it becomes available at the latch output pin (L2OUT) for use in any downstream logic. It then follows that data packets "B" thru "E" are stored into the latch on simulation cycles 5 thru 8.

It should be noted that the present invention doesn't require the latch clock (C2) to be active on every simulation cycle. The clock could alternate on and off with any regular or irregular periodicity, but the latch would only allow DIN updates on those simulation cycles where C2 is active. The scenario depicted in the timing diagram (15) of FIG. 1B is the most common in that it allows maximum verification throughput since the entire design (Boolean logic components and latches) will be evaluated every simulation cycle thereby achieving the highest ratio of operations to simulation cycles.

FIG. 1C depicts the same functional latch as a 2-cycle Latch Primitive (16). The preferred embodiment models 2-cycle latches as Level Sensitive Scan Devices (LSSD) which have been in use throughout many generations of computer systems throughout IBM's history, and which are now considered ordinary to one skilled in the art. LSSD latches are comprised of an L1 portion which can accept data from either a Data Input (DIN) or a Scan Input (SIN). Each of these inputs is controlled by separate latch clocks. The C1 clock allows receipt of the functional data (DIN), while the ACLK gates in the scan data (SIN). Once updated, the value of the L1 portion of the 2-cycle Latch Primitive (16) is available as input to the L2 portion of the latch. The L2 portion is modeled similarly to the 1-cycle latch primitive (14) from FIG. 1B. The data propagating from L1OUT of the L1 portion is gated into the L2 portion when the C2 clock is active. Data gated into the L2 portion of the latch is available to the L2OUT output pin on the next simulation cycle.

Also shown in FIG. 1C, is the timing diagram depicting the operational behavior of the 2-cycle latch primitive (16). The diagram illustrates optimal simulation throughput wherein both system clocks C1 and C2 are pulsing up and down every simulation cycle. As can be seen from the diagram, a stream of input data arrives simultaneously at the L1 Portion of the latch on simulation cycle 1 with the C1 clock. This allows the data to be captured into the L1 Portion on simulation cycle 2. Since the C2 clock is also active on cycle 2, this permits input data packet A to propagate into the L2 Portion of the latch on simulation cycle 3. Concurrently, while data packet A is propagating into the L2 Portion of the latch on simulation cycle 3, data packet B is arriving at the DIN input along with the next C1 clock. Thus, the 2-cycle latch primitive contains the same data packet in each portion of the latch for a minimum of 2 simulation cycles. Our preferred embodiment refers to this type of simulation model as a 2-cycle simulation model in reference to the two simulation cycles required to propagate data through the latch when the clocks are alternating every simulation cycle.

Additionally, 2-cycle latch primitive (16) depicts input pins for the scan input (SIN) and its associated scan clock (ACLK). Although not shown on the timing diagram (17), the behavior is identical to the clocking of the DIN input with the C1 clock. The preferred embodiment of the present invention contemplates the use of the 2-cycle latch primitive for accurate gate level verification of all system operations. This includes validating the system reset sequences responsible for scanning the machine to a known initial state. This level of accuracy promotes the value of 2-cycle simulation to the overall design verification methodology.

Figure 2A:
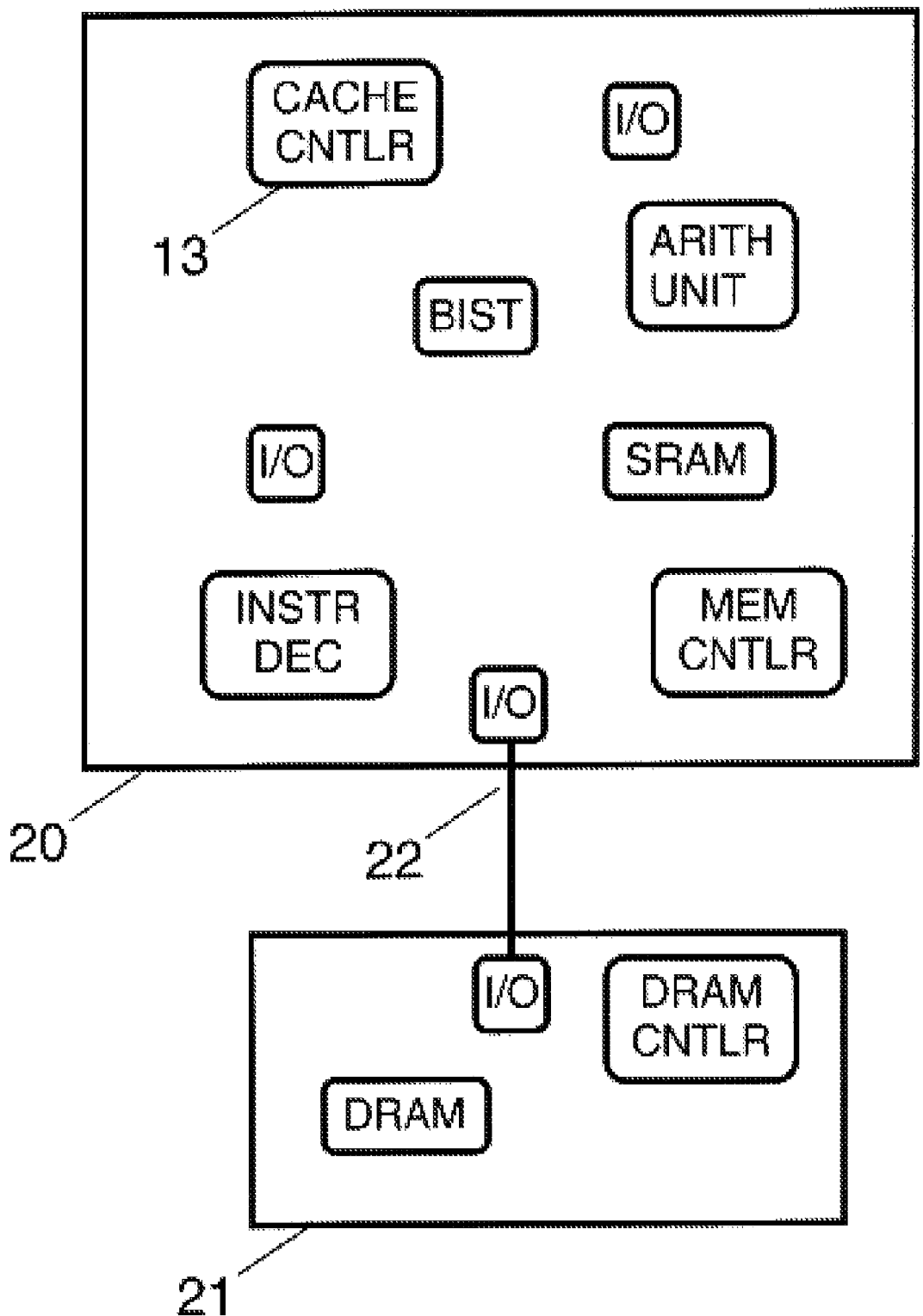
FIG. 2A illustrates an example of a computer system comprising a Main Processing Unit (MPU) and a Main Memory Unit (MMU), wherein all the design components are represented by 2-cycle CDUs.
Figure 2B:
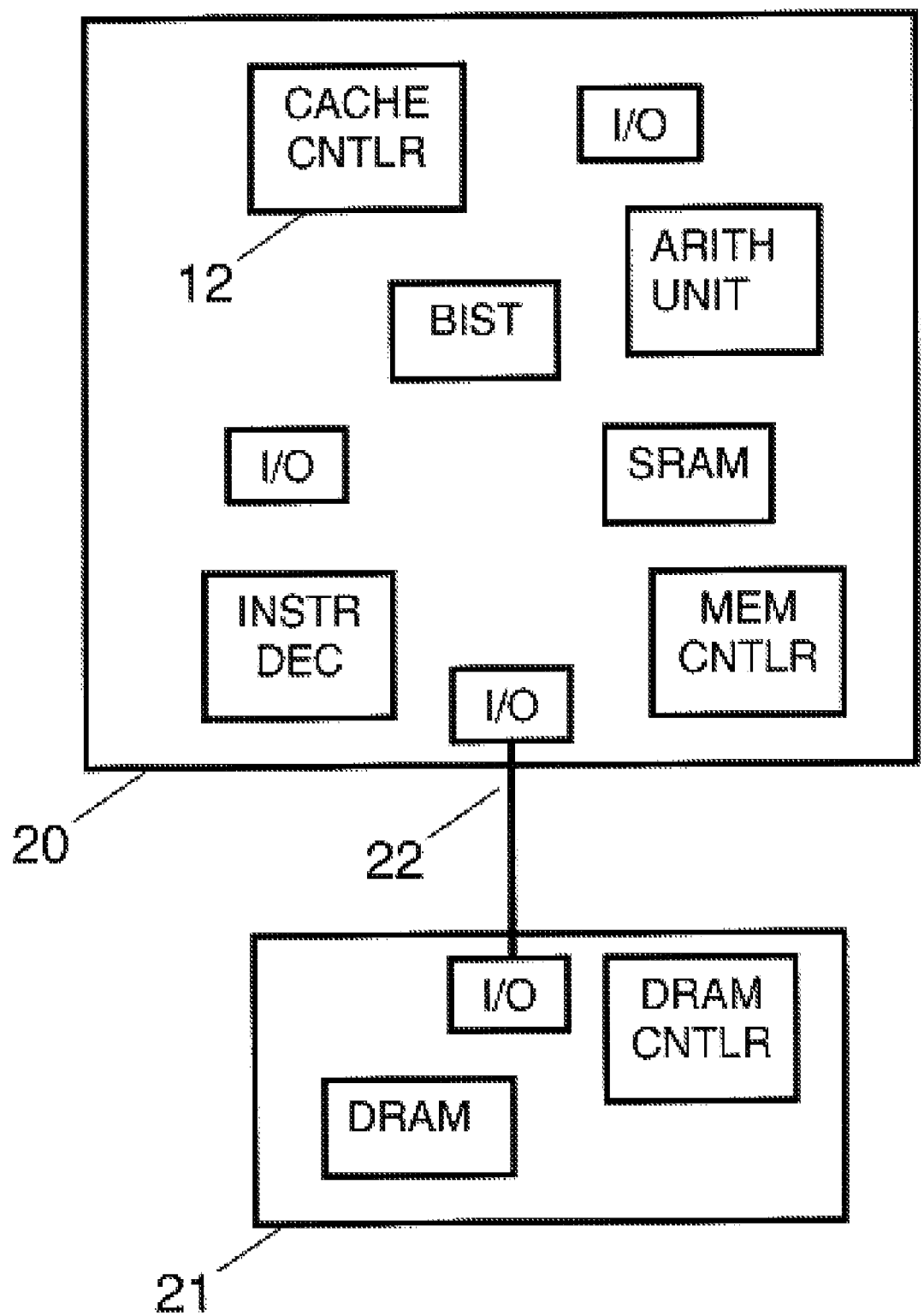
FIG. 2B illustrates an example of a computer system comprising a Main Processing Unit (MPU) and a Main Memory Unit (MMU), wherein all the design components are represented by 1-cycle CDUs.
Figure 2C:
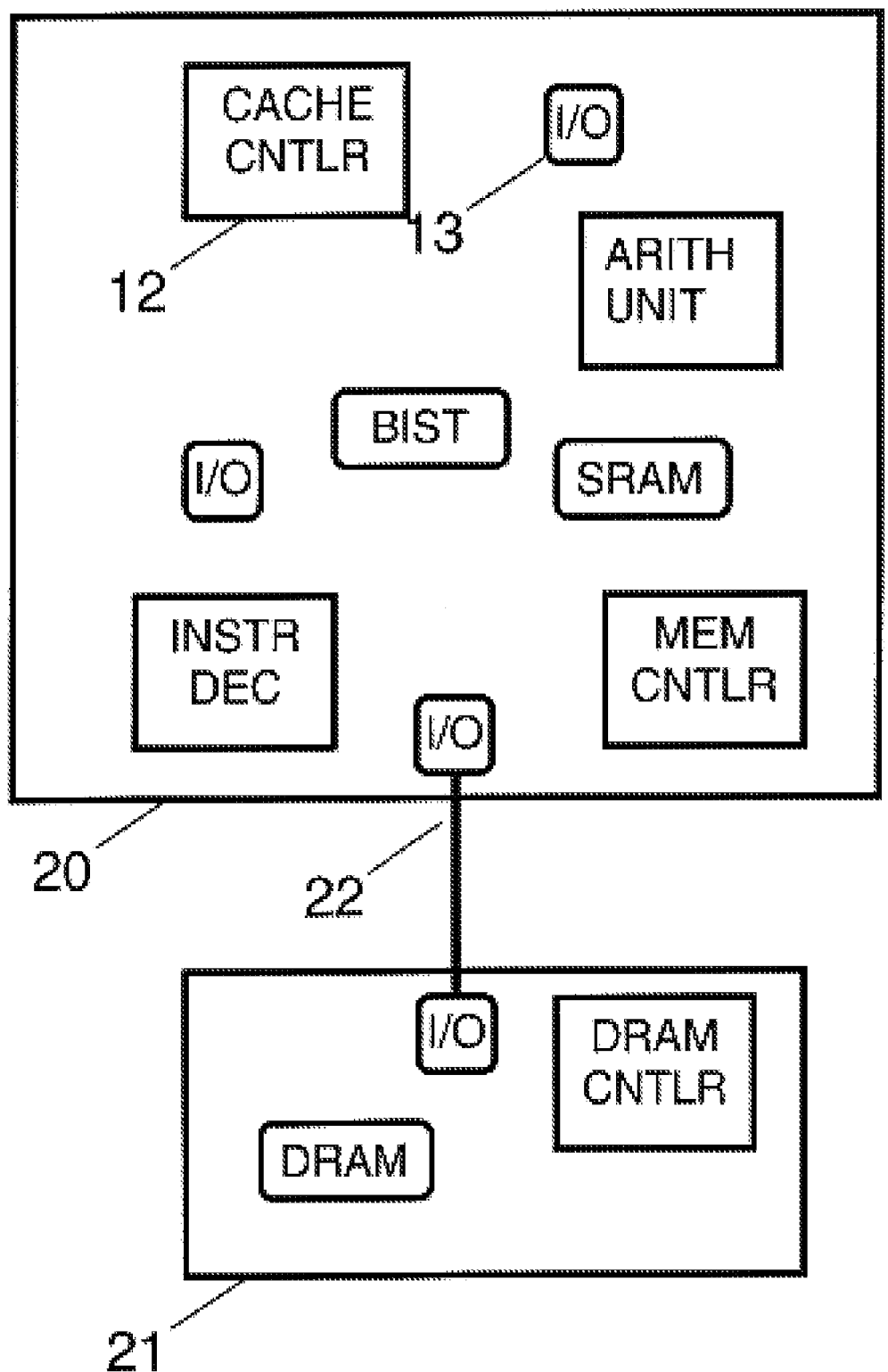
FIG. 2C illustrates an example of a computer system comprising a Main Processing Unit (MPU) and a Main Memory Unit (MMU), wherein the design components are represented by a mixture of 1-cycle and 2-cycle CDUs.

Turning our attention now to FIGS. 2A thru 2C, we can see through the use of an exemplary computer system how the present invention can be used to apply the three types of cycle simulation models to the same design source. FIG. 2A begins with an example of a computer system comprising some of the basic elements found in most computer systems. The Main Processing Unit (20) includes an Arithmetic Execution Unit, Instruction Decoder, Cache Controller, Direct Memory Access Controller, and SRAMs to provide the on-board cache, a Built-In Self Test (BIST) engine and various I/O blocks for communication with external components. Also shown in FIG. 2A, is a representative Main Memory Unit (21) comprised of the basic elements of a computer system main memory such as DRAMs, a DRAM Controller and I/O blocks. The Main Processing Unit and Main Memory Units are connected by an I/O Interface (22) operating under some prescribed protocol.

The preferred embodiment illustrates the aforementioned computer elements solely for purposes of teaching aspects of the present invention in reference to cycle simulation verification of digital logic components, and one skilled in the art can appreciated how a multitude of different elements can be substituted without imparting from the spirit of the present invention. Continuing with the example, FIG. 2A illustrates a homogenous 2-cycle simulation cycle. This is illustrated by the fact that all the elements are depicted as 2-cycle CDUs (13). Thus every element which contains latches, or other clock controlled structures, will behave as shown in timing diagram (17) in FIG. 1C. In other words the simulation environment will have to ensure the presence of C1 and C2 clocks in order to achieve proper operation of the latches.

In addition to the latches, the preferred embodiment also contemplates the use of a full speed Elastic Interface as the conduit between the Main Processing Unit and the Main Memory Unit. The Elastic Interface utilizes many of the fundamental techniques found in other source synchronous and self timed interface protocols such as those described in U.S. Pat. No. 5,832,047, Self Timed Interface. For purposes of teaching the present invention, the pertinent aspects of an Elastic Interface is to permit propagation of data across an electrical medium at very high frequencies by means of storing data bits on the interface during multi-cycle data transfers. Furthermore, the Elastic Interface achieves high bandwidth using a reduced pin count by providing a means of transferring data on both edges of the clock using double data rate (DDR) techniques. The design of the Elastic Interface in the preferred embodiment necessitates accurate clocking of the I/O blocks for achieving accurate 2-cycle simulation of the MPU-MMU Interface (22).

FIG. 2B depicts the same sample design point as FIG. 2A, but with all of the design elements represented by 1-cycle CDUs (12). This figure illustrates a homogenous 1-cycle simulation model which is used primarily for verifying architecture, interface protocols and operational sequences of the design. In the preferred embodiment, this model is driven using the timing diagram (15) of FIG. 1B wherein the latches in the 1-cycle CDUs (12) are clocked on every simulation cycle. This mode of verification permits maximum throughput as there will be no "dead" simulation cycles, and the logic elements will evaluate and change state on every simulation cycle. Since this model does not emulate accurate clocking, it is incapable of validating the Elastic Interfaces such as the MPU-MMU interface (22). Our invention contemplates a solution to this problem by means of the FACDDR method of accurately propagating the data across this interface. The details of this method are discussed in more detail later in this application.

Historically, FIGS. 2A and 2B represent the two choices available for Verification Engineers depending on the focus of the verification effort. As stated above, the 1-cycle simulation model in FIG. 2B focuses on architectural and operational behavior. The traditional 2-cycle simulation model shown in FIG. 2A is intent on validating those aspects of the system that require accurate clock sequences such as Logic and Array Built in Self Test (LBIST/ABIST), SRAM array reads/writes, clock buffering and distribution systems, interaction with Phased Lock Loops (PLLs), Elastic Interface I/O and interaction between elements involving or crossing multiple frequency domains.

Turning our attention to FIG. 2C, this illustrates the novelty of the present invention, wherein a hybrid cycle simulation model is constructed using the same design source as the homogenous simulation models shown in FIGS. 2A and 2B. In this example, the Cache Controller, Arithmetic Execution Unit, Memory Controller, and Instruction Decoder are built with 1-cycle CDUs (12) while the BIST, SRAM and I/O Blocks are constructed with 2-cycle CDUs (13). In the preferred embodiment, this offers advantages of both types of simulation models by which accurate clocking is emulated to validate proper functionality of the Elastic Interface between the Main Processing Unit and Main Memory Unit (22) along with other aspects of the design such as SRAM and BIST functions. For the remaining elements, such as the controllers, the main intent of a hybrid model is to validate their operational and architectural behavior. Thus, it is not necessary to incorporate accurate clocking of those elements. Rather, their latches are only clocked on the simulation cycles wherein C2 is active, and the logic remains stable on alternate cycles. As will be seen in later figures, this provides a significant model size and throughput benefit in comparison to running the homogenous 2-cycle simulation model of FIG. 2A.

Figure 3A:
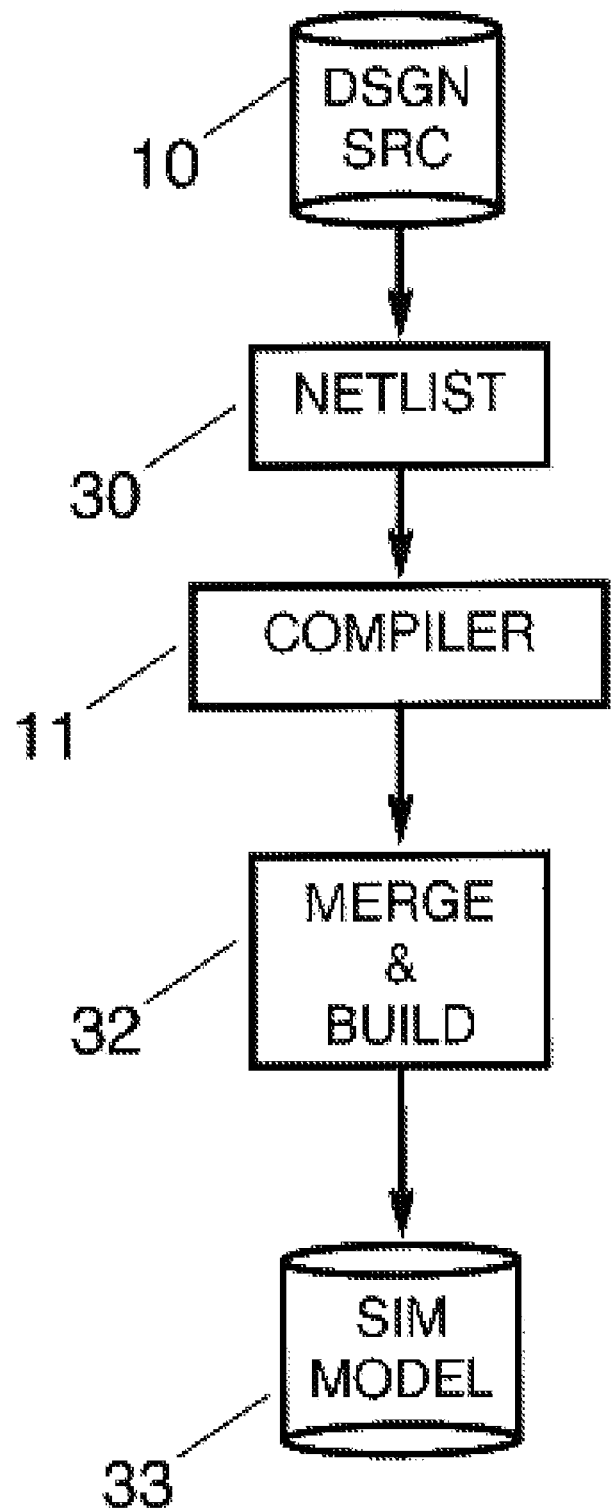
FIG. 3A shows a flowchart describing the overall Cycle Simulation Model Build process envisioned by the preferred embodiment.

FIG. 3A represents the overall cycle simulation model build steps employed by the preferred embodiment. The process begins with the Design Source (10) which represents all the elements necessary for verifying some aspect of the design defined by an arbitrary boundary. This may be the entire computer system, a sub-system, a physical unit such as a chip or card, or some arbitrary functional unit. Typically, large design projects require several different simulation models representing boundaries of differing sizes. Although depicted as a single entity, the Design Source (10) symbolizes a plurality of data objects such as a multitude of VHDL or Verilog files, schematics, pinout listings, state machine representations, functional truth tables, etc.

The myriad of Design Source (10) is fed into the Netlist (30) step which is responsible for traversing the hierarchy beginning with the top or highest level element, and then recursively descending through intermediate levels of hierarchy until all the lowest level elements have been analyzed. As the Netlist process traverses the hierarchy, it performs boundary connection checking to ensure all the lower level components properly bind with the higher level components. Additionally, it ensures all the components within a level of hierarchy connect to each other correctly. Those elements represented by Register Transfer Level (RTL) design source are simply checked for proper binding and passed on to the next step.

We have already discussed the Compiler (11) step which is identical to that described from FIG. 1A. The Compiler (11) takes the RTL design source, along with the interconnect information produced by the Netlist (30), and generates Compiled Data Units (CDUs). These will be 1-cycle, 2-cycle or a mixture depending on the type of model being constructed. In the preferred embodiment of the present invention, the Netlist (30) step produces structural VHDL for all the Design Source (10) represented by graphical schematics. These graphical schematics are commonly found throughout the Electronic Design Automation (EDA) industry as part of design entry tools such as the Composer Schematic Entry tool offered by Cadence Design Systems Inc. This structural VHDL is compiled along with the RTL VHDL to produce a complete set of CDUs which represent the entire design under test.

A key aspect in the present invention is the underlying means of identifying or "tagging" specific design components in order to direct the Compiler (11) to create a 1-Cycle or 2-Cycle CDU representation of the component. In the preferred embodiment, the Hybrid Cycle Simulation model is built with all the Elastic Interfaces (I/O blocks) represented by 2-Cycle CDUs (13) while the remainder of the design components utilize 1-Cycle CDUs (12). This is accomplished by categorizing all the EI I/O blocks within the data management system using a prescribed nomenclature. The Compiler is then instructed to use the 2-Cycle latch and clocking primitives when constructing CDUs for any design component matching the EI nomenclature. Since the preferred embodiment interacts with an advanced data management system, this method is easily extendible for other design components that could also be targeted for 2-Cycle CDUs in a hybrid model. For example, should the need arise to include the BIST components, they are also readily identifiable by nomenclature.

While the method for tagging design components for 2-Cycle CDUs is taught based on the data management system and design methodology employed in the preferred embodiment, one skilled in the art can appreciate the myriad of alternative approaches which would serves as suitable substitutes. The present invention requires some means of identifying those design components for which 2-Cycle CDUs (13) should be used in place of 1-Cycle CDUs (12). For those design components, the Compiler (11) will be instructed to employ 2-Cycle CDUs (13) with corresponding L1/L2 latches and complete clocking infrastructures within the design component. With the advancement in present day design tools and methodologies, one can easily envision tagging design components by one or more of the following alternate means:
   use of attributes provided by a data management system
   use of attributes within the source design language (i.e. VHDL attributes)
   maintaining a list or flat file enumerating each design component
   use of categories, groups or similar classification methods within the design repository The final step is the Merge & Build (32) step which reads in all the CDUs in accordance with their hierarchical relationship. As they are being read in, they are flattened into one large representation of the design wherein all logical copies of an element are expanded into unique instances, and internal data structures are created to represent the various facilities that comprise signals, logic gates and storage elements of the design. Since the present invention permits a mixture of 1 and 2-cycle CDUs in the same simulation model, this step is responsible for merging both types into the internal data structures. Finally, optimization is performed to produce the most compact Cycle Simulation Model (33) possible while still accurately representing the design.

One of the novel aspects of the present invention involves the use of a dynamic selection mechanism to determine the level of detail by which each design element will be represented in the simulation model. For example, the preferred embodiment contemplates the use of a homogenous 2-cycle simulation model to verify proper clocking of the design. In this situation, one would want each element represented in its most detailed form, usually at the gate level. This verifies both the cycle to cycle relationship of the logic with respect to their clocks as well as the interconnections throughout the clock infrastructure.

On the other hand, the preferred embodiment incorporates a homogenous 1-cycle simulation model for verification of operational sequences. This model presumes things such as low-level clock infrastructures are behaving properly, and instead focuses on architectural and protocol issues. In this case it is sufficient to represent the design elements in their RTL form. Since the verification effort is directed away from low level aspects of the design, it is usually necessary to "black box" some of the hierarchy. This artificial boundary serves to either omit the underlying components from the simulation model, or replace the actual design with a representative behavior suitable for a 1-cycle model.

Figure 3B:
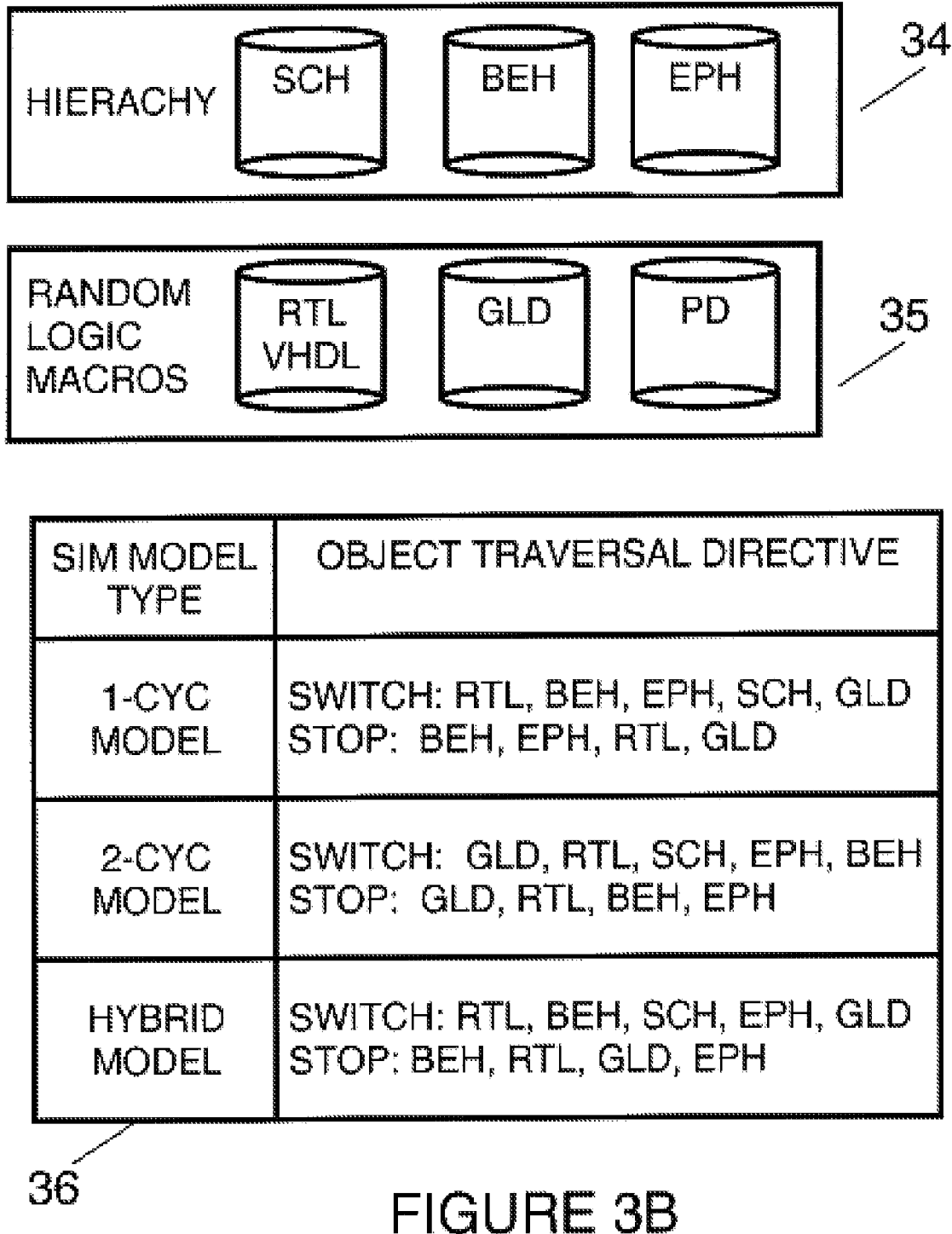
FIG. 3B depicts the multitude of data types for alternate descriptions of a design component, along with the Object Traversal Directive which dictates how the plurality of data types incorporates into simulation models.

FIG. 3B depicts the dynamic selection mechanism through the use of an example from the preferred embodiment. The sample design is divided into two classifications. The first is hierarchy (34) which represents any arbitrary scope of design hierarchy. Typically, design hierarchy is maintained through schematic data files, shown in the hierarchy (34) as SCH objects. The schematics instantiate lower level components which may be additional levels of hierarchy (i.e. more schematics) or logic macros (35). Schematics may also have a plurality of alternate representations. FIG. 3B illustrates the two most common: Behaviorals (BEH) and "Emulation Placeholders (EPH). Typically a given design component will utilize one or the other, but not both.

The main difference is a Behavior provides an alternate functional description of the schematic intended to circumvent incompatibilities or limitations arising from attempting to incorporate all of the underlying elements into a particular simulation environment. For example, a schematic representing a clock chopper circuit would be troublesome in a cycle simulator since it is unable to resolve delay elements. If one wanted to validate all the interconnects between the clock chopper hierarchy and the remainder of the design, they could circumvent this restriction by creating a simple Behavior in which the output of the clock chopper schematic follows the input through the use of a simple signal assignment statement.

Although most designs can be partitioned into some type of hierarchy that lends themselves to the use of Behaviors to get around the aforementioned limitations of cycle simulators, there can be circumstances wherein design elements need to be completely excluded from certain cycle simulation models. Our invention contemplates the use of an Emulation Placeholder (EPH) to serve such a purpose. In the preferred embodiment, we propose the use of the FACDDR method to emulate the functional behavior of complex design entities such as an Elastic Interface. FACDDR interacts directly with the simulation environment, thereby obviating the need to create any behavioral description of the Elastic Interface design. According to our preferred embodiment, application of said principle to a 1-cycle simulation environment yields several advantages discussed in more detail later. The Elastic Interface hierarchy serves as an example of the use of an Emulation Placeholder (EPH) as opposed to a Behavioral description (BEH). The EPH is merely an empty data object (or blank data object) which serves as a guide for the Object Traversal Directives (36).

The other main category is the Logic Macros (35). Although only one macro is shown in FIG. 3B, designs typically contain a multitude of logic macros which are also known as Random Logic Macros (RLMs). The scope of each macro is dependent upon many factors and can range from something as simple as a latch or register to something complex such as an interface or memory controller. In the preferred embodiment, each logic macro has 3 types of data objects to describe the design. They are the Register Transfer Level (RTL) VHDL, the Gate Level Design (GLD) and one or more Physical Design (PD) files such as layouts, timing data, contracts, etc. Only three objects are shown for simplicity, but one skilled in the art will appreciate that the actual number and classification of data objects is closely tied to the design methodology and underlying tool set.

The preferred embodiment of the present invention enables the dynamic selection mechanism through the use of Object Traversal Directives (36) shown at the bottom of FIG. 3B. These OTDs are part of the Netlist (30) step in FIG. 3A with the appropriate directive selected according to the desired simulation model. As shown in FIG. 3B, each OTD is comprised of two lists of data types. The Switch List is a prioritized list that directs the Netlist step on which data object type to include in the model when a particular design element is represented by a plurality of data objects. For instance, since most Random Logic Macros are described with both RTL VHDL and a Gate Level Design (GSD) representation, the Switch List will determine which type is used in the associated model. The second component is the Stop List which indicates whether the Netlist step should attempt to traverse through that data type or pass it on to the Compiler (11) as is. For example, Schematics data types (SCH) are always traversed by the Netlist step so they never appear in the Stop List, whereas the Behavioral representation (BEH) of the same piece of hierarchy is never traversed. As the Netlist step (30) selects each data object, based on the prioritized Switch List, it will attempt to descend into that object unless said object is a member of the Stop List.

The Object Traversal Directives (36) are a key feature in enabling the Hybrid Cycle Simulation model in the present invention. Since the primary purpose of a Hybrid simulation model is to permit some aspects of the design to be represented with 2-cycle CDUs while the remainder of the design is compiled as 1-cycle CDUs, a means must exist to determine how the components will be compiled. This can be seen by means of comparison between the three object types belonging to the Hierarchy classification (34). In the 1-cycle model the switch list prioritizes EPH over BEH and BEH over SCH. Thus, any existing alternate representations will supercede the actual schematics for hierarchical design components.

Conversely, in a 2-cycle model, the actual schematics (SCH) take precedence over both EPH and BEH. This follows since the intent of a 2-cycle simulation model is to validate the actual design to maximize accuracy and ensure the components function as closely to the real silicon as possible. This leaves the Hybrid model which is a compromise between the two extremes. In this case, the Switch List sandwiches actual Schematics (SCH) between Behaviorals (BEH) and Emulation Placeholders (EPH). Thus, hierarchy such as the aforementioned clock chopper example would be represented with a substitute Behavior (BEH), while the Elastic Interface hierarchy would be represented with the actual Schematics (SCH).

Use of the real schematics in the Hybrid model enables accurate cycle simulation taking into account proper clock gating, whereas other areas of the design, such as BIST, which aren't the focus of the model can be substituted by a Behavioral (BEH). The difference between the Behavioral (BEH) and Emulation Placeholder (EPH) can further be understood by way of the Elastic Interface example. Since the preferred embodiment utilizes FACDDR for manipulating the Elastic Interface in the 1-cycle model, all the EI hierarchy components have EPH objects in the library. This prevents the actual Schematics from being incorporated into the 1-cycle model. Attempts to use an empty BEH object for the EI hierarchy components would succeed for a 1-cycle model, but would pose a problem with the Hybrid model. Since the BEH supercedes the actual SCH objects in a Hybrid model, the end result would be the empty BEH also being incorporated into the Hybrid model, instead of the desired SCH object.

Figure 3C:
FIG. 3C shows the results of applying the Object Traversal Directives for the various cycle simulation models.

Finally, FIG. 3C depicts the Simulation Results Table (31) which illustrates how the various components in the preferred embodiment are chosen for the plurality of simulation models, based the model's Object Traversal Directive. In the case of the Random Logic Macros, the RTL VHDL is used for both 1-cycle and Hybrid models. The clocking infrastructure is represented as Behavioral VHDL in both models. However, the Elastic Interface I/O Blocks use an Emulation Placeholder (EPH) for the 1-cycle model and Gate Level Design for the Hybrid model. The 2-cycle model always uses the Gate Level Design for all design components.

Figure 3D:
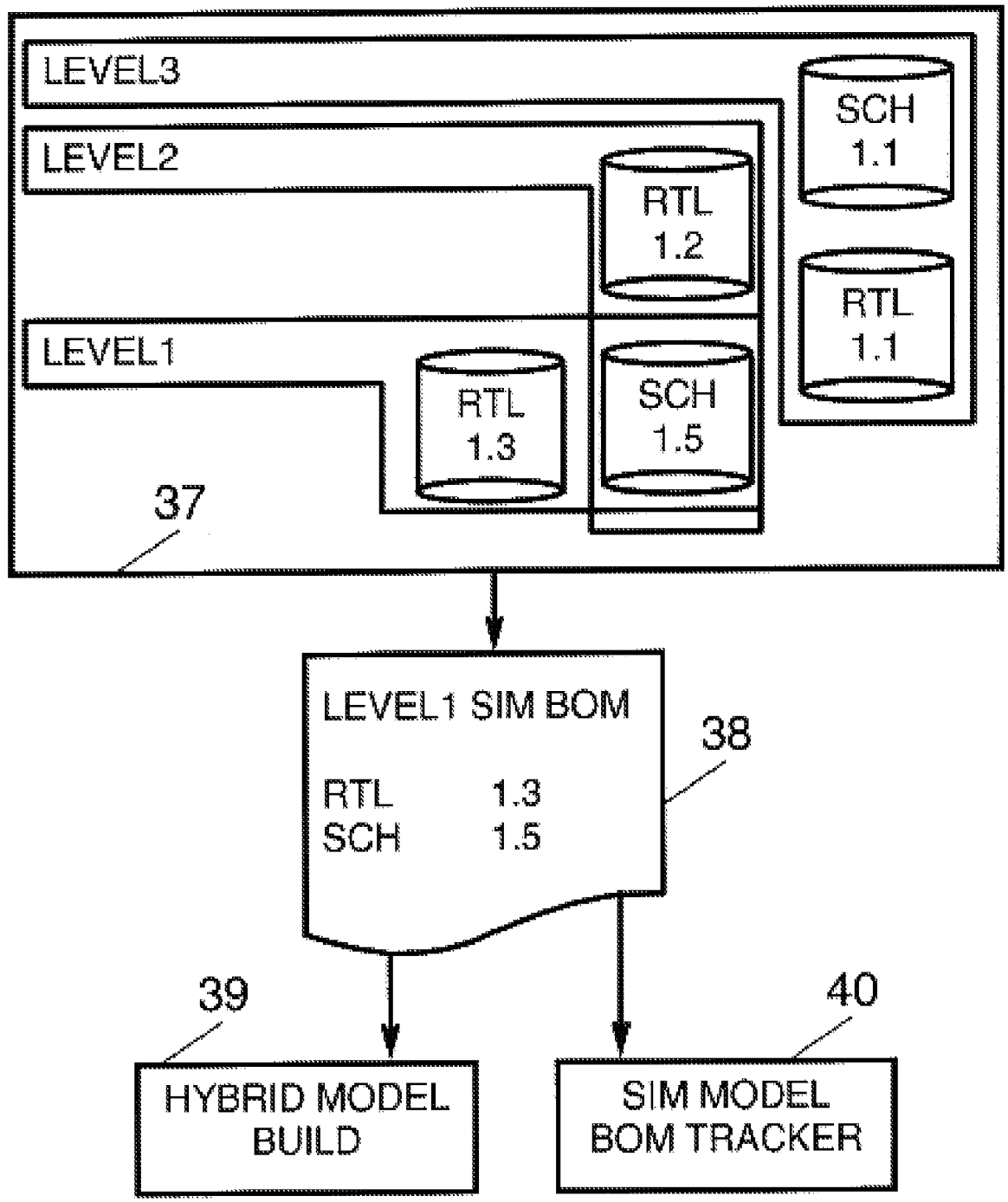
FIG. 3D illustrates a representative Data Management System along with a means for the present invention to interact with said DM System.

Another aspect of the present invention is the ability to interact with a formal data management system in order to track the Bill of Materials involved in the constructing the Hybrid Cycle Simulation Model. Turning our attention to FIG. 3D, we see of representative Data Management system (37) in which the aforementioned data objects from FIG. 3B reside in a repository. One skilled in the art can appreciate the variety of Data Management systems (DM) available with which the present invention can interact with. The typical DM system involves libraries which manage the various design components using a version control mechanism. FIG. 3D illustrates the DM system of the preferred embodiment which encompasses the IBM Data Management System described in U.S. Pat. No. 6,088,693, Data Management System for File and Database Management.

In addition to simple version control, this DM system provides a scaleable data management paradigm which permits various levels of the design to be managed concurrently. As seen on the figure, the library (or vault) houses three versions of an RTL data object and two versions of a SCH data object. The higher version numbers indicate the more recent design iteration. So Level1 comprises the most recent design iteration since it contains Version 1.3 of the RTL and 1.5 of the SCH. On the other hand, Level3 depicts the oldest iteration of the design since it contains the initial versions of both data objects. In the preferred embodiment, the Netlist (30) step triggers off a given library level to interact with the DM system to perform a library search at said level. The DM system constructs the Bill of Materials (38) listing shown in FIG. 3D using the results of the library search. The actual data types included in the list are dictated by the Object Traversal Directive (36), and are used to drive the Hybrid Model Build process (39).

Upon completion of the model build, the Bill of Material (38) listing records the precise iterations of design components incorporated into said Hybrid Cycle Simulation Model. As time elapses, new iterations of the design are introduced into the DM system, so another aspect of the present invention is the use of a Simulation Model BOM Tracker (40) to continuously compare the versions of design components which comprise the model against the current versions of the same components in the library. In the example shown in FIG. 3D, a Hybrid Model built from Level1 component would contain versions 1.3 and 1.5 of the RTL and SCH objects respectively. If the RTL is updated in Level1 the day after the model build occurred, then version 1.4 would exist in Level1. The BOM Tracker (40) would detect the update to Level1 and provide notice that the Hybrid Simulation Model is obsolete, and no longer represents the latest design iteration.

Since the preferred embodiment of the present invention instantiates the latches and array primitives in our models, the easiest way to create a single cycle and two cycle model is by using two distinct sets of latch and array primitive packages. It should also be noted that an alternate embodiment can be envisioned wherein a single cycle model is derived from the two cycle model by using phase abstraction. Phase Abstraction is the term for the automated process or algorithm that takes a multiple phase design with level sensitive latches wherein each phase updates independently and generates a 1-cycle model. It must identify the different latches used on the different cycles (L1 latches versus L2 latches) and "abstract" a single phase. This technique is done frequently within formal verification tools. One skilled in the art can appreciate how the hybrid model build of the present invention can be employed using either means to create and manage latch primitives.

Another aspect of the present invention is the ability to manipulate the clocking infrastructure of the design under test in order to permit different components to be controlled by different clock rates, which is imperative in a Hybrid Cycle Simulation model. Consider the simple example shown in FIGS. 4A thru 4C which illustrates the design's clock infrastructure represented by the CLK_TOP clock hierarchy (42) comprising the underlying clock macros (41). Typically, the clock macros contain the necessary buffering, controls, initialization logic, phased lock loops (PLL), feedback circuitry, etc., and they are usually interconnected in an "H-Tree" or grid-like fashion. The clock hierarchy (42) accepts an external oscillator or reference clock to drive the underlying PLLs and then drives one or more clock outputs to the downstream logic components.

In the preferred embodiment, the output of said clock hierarchy (42) is a master clock signal known as CLKG which feeds every logic macro on the chip. Each macro contains internal clock blocks which divide CLKG into the C1 and C2 clocks shown in FIG. 1C. Returning to FIG. 4A, two of the downstream macros (Memory Controller and Elastic Interface I/O block) are shown receiving CLKG. It can be seen that both macros are represented by 1-cycle CDUs (12) which indicates FIG. 4A is a 1-cycle Simulation Model. As previously stated, since the 1-cycle model is used for architectural an operational verification, the preferred embodiment will use the Behavioral description (43) shown for CLK_TOP. The BEH (43) is a simple VHDL description in which the CLKG output pin is assigned the oscillator (OSC) input. The simulation environment of the preferred embodiment drives the OSC pin to an active state on every simulation cycle.

FIG. 4B, on the other hand, shows the same example design with the MEM and I/O macros compiled as 2-cycle CDUs (13) for inclusion in a 2-cycle Simulation model. In this case, the intent of the model is to accurately simulate all aspects of the design, including the clock infrastructure. Thus, the actual SCH representation of CLK_TOP is used instead of a Behavioral. This allows the Netlist (30) step to descend and pick up all the lower level clock components.

The 1 and 2-cycle models describe the opposite ends of the extremes wherein either the entire clock infrastructure is incorporated into the simulation model, or an alternate representation is used to "black box" the hierarchy. A Hybrid model presents a problematic situation wherein a mixture of 1 and 2-cycle CDUs coexist, thereby requiring different clocking. FIG. 4C shows the example design in a Hybrid model with the MEM macro represented with a 1-cycle CDU (12) and the I/O Block represented with a 2-cycle CDU (13). Since the mixture of CDUs in a Hybrid model tend to favor 1-cycle CDUs (12), it's more efficient to utilize a Behavioral to drive the clocks to the 1-cycle CDUs. However, accurate simulation of the 2-cycle I/O CDU (13) requires accurate clocking.

The present invention teaches the solution shown in FIG. 4C, wherein a modified CLK_TOP hierarchy (44) is employed to provide separate CLKG outputs labeled CLKG and CLKG_1. The original CLKG output is used to drive all the downstream 1-cycle CDUs (12), while the secondary CLKG_1 pin drives all the downstream 2-cycle CDUs (13). As illustrated in the CLK_TOP hierarchy (44), both pins are driven by a common source. This is necessary for use in the 2-cycle model since it's essential that all CLKG nets behave identically. For 1-cycle models, the Behavior from FIG. 4A is modified as the updated CLK_TOP Behavior (45) which simply shows both CLKG outputs being assigned to the input Oscillator. In the preferred embodiment, the updated CLK_TOP hierarchy (44) allows the Hybrid simulation environment to exploit the CLKG_1 net by providing a unique signal to control. During simulation run-time, the simulation environment toggles CLKG_1 to emulate accurate clocking for the I/O block.

One skilled in the art can appreciate alternate solutions that also permit separate clocking of the 1 and 2-cycle CDUs. One such alternate embodiment is described in a third representation of the CLK_TOP Behavior (46) shown at the bottom of FIG. 4C. Here, the opposite approach is used. Instead of constantly driving the oscillator active, and using the simulation environment to toggle the CLKG_1 net, this alternate embodiment has the BEH intercede to drive the CLKG net to a constant active value. The CLKG_L is assigned to the oscillator, thereby allowing the simulation environment to control the reference clock in any desired fashion.

It should be understood that the present invention offers many more possible embodiments to construct and exploit Hybrid simulation models than the few examples demonstrated herein. For instance, the examples focus on two clock domains wherein the Elastic Interface I/O blocks are simulated using the accurate 2-cycle clocking while the remainder of the design uses a simple "always active" CLKG. One skilled in the art can appreciate how this concept can be expanded to more complex designs involving a plurality of frequency domains wherein CLKG_1 is replicated as many times as needed. Each subsequent copy of CLKG can be used to drive a different frequency domain. For example, the I/O blocks may require CLKG_1 to alternate with a period of 1-cycle up and 1-cycle down. Additionally, there might be an embedded DRAM whose macros need to be accurately simulated and require clocking with a period of 3 cycles up and 3 cycles down. By creating a CLKG_2 net, and using it to drive the embedded DRAM 2-cycle CDUs, one can easily envision how the I/O blocks can be controlled independently of the DRAM macros.

Among the plurality of advantages offered by the present invention are the improvements one gains in both simulation model size and performance over traditional 2-cycle models. FIG. 5 shows these improvements in tabular form using a single design model in the preferred embodiment as a reference for comparison. The same design source was used to build a traditional 2-cycle model and the hybrid model using the process described in FIGS. 3A thru 3D. The size table (51) shows a 31% savings in overall model size with 34% savings in the number of primitive building blocks and a 57% improvement in the number of latches. Obviously the actual numbers will vary depending on the content of the model and the savings will be indirectly proportional to the percentage of design represented by 2-cycle CDUs. However, most designs contain a majority of logic which can be accurately verified in a 1-cycle environment. Therefore, the savings will frequently be substantial.

Similarly, the Simulation Model Performance improvement table (52) in FIG. 5 also shows the benefit of a hybrid model as compared to a single cycle (1-Cycle) and 2-Cycle representations of the same design source. As can be seen from the table, the performance of the I-Cycle model is almost five times faster than the 2-Cycle which serves as the baseline since it's the slowest performing model. This illustrates why it's so desirable to use a 1-Cycle model for architectural and operational verification. It follows that any Hybrid Cycle Simulation model will perform better than the baseline 2-Cycle model but worse than the best-case 1-Cycle model. The actual performance depends on the percentage of the design source represented by 2-Cycle CDUs versus 1-Cycle CDUs. In the preferred embodiment, where virtually all the I/O blocks are represented by 2-Cycle CDUs, the performance is still 1.65 times faster than a homogenous 2-Cycle model.

Up to this point, the present invention presents a means of constructing a hybrid simulation model wherein any design component can be targeted for 2-cycle simulation while remaining components are comprised of 1-cycle compiled data units. One of the main aspects of our invention is the use of the same design source for inclusion in a single cycle, multi cycle or hybrid model. However, certain design elements such as the Elastic Interface (EI) logic in our preferred embodiment necessitate transitional clocking in order to operate properly. Thus, these components must be represented by some other means in a 1-cycle simulation environment. Although one possibility is the creation of a Behavioral (BEH) to emulate the functionality of the EI logic, the underlying complexity required to make it suitable for a single cycle model offsets the advantages of including it in a 1-cycle model. Our invention contemplates another solution to this problem in the form of the FACDDR interface emulation facility.

FACDDR is a software element (written in C++) embodied in a tangible media suitable for verification of a digital design. It works through a simulation API to interact with a software model of a logic design under test. FACDDR is associated with a receive/drive pair of IO blocks and the busses connecting said IO blocks. It provides a means to interact with the IO blocks through the use of an Application Program Interface, and can also replace the behavior of the associated components.

FIG. 6 illustrates a standard simulation workstation comprising a system unit (60), with one or more processing units (CPUs) and internal main memory, a monitor (61), keyboard (62), and comprising one or more permanent storage devices such as a hard drive, CD-ROM, and/or floppy drive. Additionally said workstation may include a network connection (63) to a plurality of other workstations (64) acting as clients or server, thus providing a simulation environment suitable for any type of design verification. These workstations (60 and 64) enable the execution of the program instructions which constitute the FACDDR software entity.

Architecturally, FACDDR is comprised of the elements depicted in FIGS. 7A and 7B. The FACDDR object is a C++ class that interacts with Verification Code (76) through the Application Program Interface (71) and with a simulator running a Hardware Description Language model through a simulation application interface layer (SIMAPI). Verification code (76) generally consists of programs that drive stimuli (drivers) into the Design Under Test (DUT) and checking code (checkers) that monitors inputs and outputs from the Design Under Test. Appendix A provides FACDDR psuedo-code illustrating the available functions for interfacing with the present invention.

Turning our attention to FIG. 7A, the FACDDR object consists of data and control code. The Control Data and Control Code (70) consists of information about the delays, the mode that determines what facility accesses and alterations should be performed by FACDDR, and a description of which bits of which wires and registers should be connected to the Drv Reg, wire, and Rcv Reg in the DUT. The information about connections to the DUT are stored as a helper object called RNDFAC for the wire, and a set of lists, under the subclasses of DDRDest, containing a RNDFAC, clock control facilities and bit range information for each of the Drv Reg and Rcv Reg entities. DDRDest also provides an option for specific delays in the case where it is necessary to offset the timing for one or more of the destination or source registers from the basic delay in the FACDDR. The set of lists allows for separation of the first and second cycle of data on the double data rate interface. The lists themselves allow for Drv and Rcv Reg data to go from, or to, multiple registers and/or bit ranges for concatenation and fan out. The delays for first and second cycle of data for double data rate use are specified and kept separately, as sometimes they may differ depending on the interface protocol.

The data mainly consists of a Data Buffer (72) to hold the data for the Drv Reg and the Rcv Reg and staged data to model the delay between the two. Based on the operating mode and delays chosen for the FACDDR object, the data from the buffer can be accessed as the data in the Drv Reg, wire, and Rcv Reg with an optional offset (described elsewhere). The interfaces to the buffer through the API (71) for Drv Reg, wire, and Rcv Reg are available whether they are connected to real or virtual registers and latches in the DUT, and in this way can be used as virtual facilities when needed or desired. FACDDR can be configured to allow virtual facilities in a simulation API (SIMAPI) to be optionally employed. FACDDR also provides an option to alias the L1 and L2 portions of an L1/L2 latch together so that only the L2 portion of the latch need be given for the Drv and Rcv Regs, and FACDDR will use rules that are embedded in the code to determine the name of the L1 portion of the latch. Both the L1 and L2 portions of the latch can be set to the same value during facility altering. This can be useful when both 1-cycle and 2-cycle models are being supported. The mapping rules could be made more flexible using pattern matching passed in through new API calls.

The RNDFAC (73) class is a convenience, or simulation helper, class built around the SIMAPI FACOBJECT (74) class. This is intended to provide for more convenient size checking and facility alter/access functions. RNDFAC (73) can also be used with a manager to provide some functionality which may not be present in a particular SIMAPI such as lists of automatic accesses and alters that keep the RNDFACs in sync with the DUT. The SIMAPI provides the actual method of interaction through accesses and alters to the DUT in the simulator.

Continuing with FIG. 7B, a manager class known as FACDDRDB exists, which assists the Verification and Checking Code (76) in keeping track of active FACDDR objects and making the API (71) execution calls for a collection of FACDDR objects. The manager contains one or more FACDDR LISTS (78), which is basically a keyed list using a string name for a FACDDR and a FACDDR object. FACDDRs in the list can be accessed by passing a string name for a FACDDR to the manager and getting a pointer to the FACDDR as a return value. The FACDDRDB also has Control Code and Control Data (77) to take advantage of features in the SIMAPI, if it supports them, for creating automated get and fetch lists for improved performance. The Control Code also contains a means to build a list of FACDDR objects from an I/O control (IOC) file. This is especially helpful if the IOC file is used to generate the Hardware Description Language for the actual design where one file is used as the source for both the HDL and FACDDR representations.

In order understand the present invention, it is best to teach it in the context of the preferred embodiment comprising an Elastic Interface used as a transmission medium for transmitting data between two components with a fixed propagation delay of 1 or more clock cycles. The block diagram shown in FIG. 8 illustrates the application of the FACDDR (80) software entity in the context of using it to drive and monitor an interface described in the logic simulation model. A Driver logic module (81) drives information across a bus to another Receiver logic module (87) which receives the information. The driving logic will typically have a set of Drvreg latches (82) to hold the information it will be driving onto the bus. There may be some logic or delay before the information reaches the bus itself. The information from the bus will then be received at the other end, after possibly incurring some delay on the bus, and/or passing through some logic or delay in the receiving logic module before being stored in a set of Rcvreg latches (86) which hold the incoming information.

FACDDR supplies an API (71) to set and retrieve the values of the Drvreg (82), Rcvreg (86), and the Interface Bus (84). Further, if one or both of the Driver (81) or Receiver (87) is replaced with a software element to emulate the design component, (for example, a C++ program to replace Driver (81) which provides stimuli to test the Receiver (87) design element) and the Drvreg (82)/Rcvreg (86) does not exist in the software element, FACDDR (80) supplies a virtual register to replace the missing register. It can be accessed through the API (71) using the same calls as if the register existed in a design component. This feature allows additional software elements using the API (such as a program for monitoring/checking the behavior of the interface or design under test) to be unaware of whether or not there is a software element or design element behind the API (71).

Besides providing the monitoring (get) functions to interact with the design or software elements, Drvreg (82), Rcvreg (86) and Bus (84), FACDDR (80) can also be configured to alter (set) the Drvreg, Rcvreg, and Bus. It can be configured to set the Bus alone, or set the Bus and Rcvreg, from the real or virtual Drvreg. Alternatively, one can set the Rcvreg from the bus when it is not necessary or desirable to model the Drvreg (82). FACDDR (80) can also be configured to provide delay between the Drvreg (82) and the Bus (84), and between the Bus (84) and the Rcvreg (86). Our invention also has the ability to emulate double data rate bus transfers, where the signals on the bus can change at twice the rate of the Drvreg/Rcvreg logic. The preferred embodiment of the present invention contemplates the use of double data rate elastic interfaces between all the chips in the design as a means of saving physical interconnect pins/wires. For example, only 32 physical pins/wires are needed to transfer data on a 64 bit wide bus. The emulation of such an interface is especially useful in a 1-cycle model being clocked every cycle where it is not possible for the bus to run faster than the Drvreg/Rcvreg logic. The bus cannot be set with all of the information that would logically cross it when running in a 1-cycle simulation environment, but the FACDDR API (71) is able to return all of the information.

Using FACDDR (80) in the mode that sets the Rcvreg (86), and/or the Bus (84), can replace the behavior of the I/O blocks and Bus. As long as the Rcvreg (86) exists, this mode can be used when the logic for the receiving I/O design blocks are not available (as can happen early in the design process).

Sometimes it may even be desirable to use FACDDR (80) to replace the behavior of the I/O blocks even if they are incorporated into the Design Under Test (DUT). If the Drvreg (82) exists, FACDDR (80) can also replace the I/O blocks on the driver design element. The first case can be of use early in the design process when the I/O blocks may be lagging the logic design elements, and the second case can be used when it is inconvenient or not desirable (incorrect behavior or need to skip initialization process of the I/O blocks) to use the design based model of the I/O blocks. The second case can also be used when running in the 1-cycle model with clocking on every cycle where the design based model of the I/O blocks cannot function properly.

FACDDR (80) can work in the 1-cycle simulation environment, with clocking on every cycle, by retrieving the entire contents of the Drvreg (82) in one cycle. In a double data rate interface, this is twice as much as can be put on the bus in one cycle. FACDDR (80) then accounts for any configured interface delays, and correspondingly sets the entire contents of the Rcvreg on the appropriate cycle. If the bus is also to be set by FACDDR (80), it will only see the first half of the data in this case. The API (71) allows for both halves of the data to be accessed even in this case.

FACDDR allows delays to be set at various points in the I/O path using the following functions. The ab_select allows different delays to be set on the path for the first cycle of data and the second cycle of data when used in double data rate mode. Typical values are supplied as defaults with ab_select defaulting to set both the A and B paths together.

```
void setOutputDriverDelay( UINT32 delay_val=1, UINT32
ab_select=3 );
void setWireDelay( UINT32 delay_val=0, UINT32 ab_select=3 );
void setElasticDelay( UINT32 delay_val=1, UINT32 ab_select=3 );
void setReceiveLatchDelay( UINT32 delay_val=1, UINT32
ab_select=3 );
void setTargetCycleDelay( UINT32 delay_val=2, UINT32 ab_select=3 );
void updateTotalDelay( );
```

FACDDR allows clocking, source and destination facilities to be specified. The clocking is supplied in the form of another C++ class which runs at a specified frequency and offset and has a member function is valid( ) to indicate when FACDDR should make periodic updates. Three clocks are provided which may require different periods and offsets according to the application. There is a BusClock which represents the elastic interface bus clock, and LocalClock and LocalHalfClock for the receiving and driving latches. FACDDR facilities can have multiple destinations, each with its own clock (if needed) thereby allowing concatenation of bit range and multi-drop registers. Each destination facility is added with its own source start and end bit, indicating which bus bits will be used, and sink start and end bit. Additionally, there exists a clock for the A and B cycle receive registers along with another class used to access the real or virtual facilities in the simulator. A Boolean argument is also passed indicating whether the destination facility should be treated as bi-directional or not. Additional re-power facilities can be assigned for convenience. Source facilities are similar except that they specify driver registers as the source and the bus as the sink. Here, no re-powered copies are accommodated.

```
void setDDRBusClock( int bus_clock );
void setDDRLocalClock( int lcl_clock );
void setDDRLocalHalfClock( int lcl_half_clock );
bool addDest( UINT32 src_sb, UINT32 src_eb, UINT32 snk1_sb,
UINT32 snk1_eb,
    UINT32 snk2_sb, UINT32 snk2_eb, const RndFac *snk1,
    const RndFac *snk2, bool bidi = false,
    int inSnk1ClockSection=-1, int inSnk2ClockSection=-1,
    const RndFac *snk1_t1=0, const RndFac *snk2_t1=0,
    const RndFac *snk1_tr=0, const RndFac *snk2_tr=0 );
bool addSrc( UINT32 snk_sb, UINT32 snk_eb, UINT32 src1_sb,
UINT32 src1_eb,
    UINT32 src2_sb, UINT32 src2_eb, const RndFac *src1,
    const RndFac *src2, bool bidi = false,
    int inSrc1ClockSection=-1, int inSrc2ClockSection=-1 );
```

If source and destination are not specified, FACDDR still maintains buffers for data that would be in the source and destination facilities. Because of this, FACDDR can be used to emulate virtual facilities to some degree. This is useful when a C++ program is used to replace the driving or receiving logic design model during verification without requiring program changes beyond the FACDDR interface.

FACDDR can be run in a mode that transports data from driver latches to the bus and receiver latches or solely to monitor the facilities. This can also be controlled through API calls to enable or disable this behavior in its entirety or by selecting individually which actions are desired or not desired.

```
void disableDDRAction( );
void enableDDRAction( );
void setMoveUdDataToWire( bool inVal = true );
void setMoveWireDataToUr( bool inVal = true );
void setCaptureDataFromWire( bool inVal = true );
```

Setting facilities via the FACDDR API are commonly done using pointers to a data buffer within the FACDDR class along with a flag to indicate that new data is available. An evaluation master calls all active FACDDR objects to actually execute the facility manipulation and access. Facility accesses to data on the wire, drive and receive registers are also commonly done using pointers to data buffers. Buffer access is provided as both byte array and unsigned integer 32 arrays with the byte array commonly used for facilities of one to eight bits in length, with the integer arrays used for larger facilities. The following are example functions used to set and obtain pointers for the receive latch register buffers for both the A and B cycles. An argument, early_offset, is provided to allow access to the data in the FACDDR buffers a specified number of cycles before they would typically be used. Functions exist for the drive registers and bus registers which are similar.

```
BYTE *getCurPutDataDDRA( ) const
{ return(cond_put_data_ddr_a); };
UINT32 *getCurPutDataIntDDRA( ) const
{ return(cond_put_data_int_ddr_a); };
BYTE *getCurPutDataDDRB( ) const
{ return(cond_put_data_ddr_b); };
UINT32 *getCurPutDataIntDDRB( ) const
{ return(cond_put_data_int_ddr_b); };
BYTE *getCurPutURDataDDRA( UINT32 early_offset = 0 ) const;
UINT32 *getCurPutURDataIntDDRA( UINT32 early_offset = 0 ) const;
```

-continued

```
BYTE *getCurPutURDataDDRB( UINT32 early_offset = 0 ) const;
UINT32 *getCurPutURDataIntDDRB( UINT32 early_offset = 0 ) const;
```

A restriction does exist to allow code using the FACDDR API (71) to work with both multi cycle clocking and single cycle clocking. When it is desirable to see the actual values on the bus during multi cycle clocking, FACDDR bus accesses must be done on the last cycle of the bus transfer. This allows FACDDR (80) time to collect both halves of the double data rate bus for presentation through the API (71) with one call whether multi cycle clocking is used (data is actually on the bus in two halves at different cycles) or single cycle clocking is used (data is held internal to FACDDR and is by necessity all available at once.) Similarly it is recommended that facilities are set on the first cycle of the bus transfer to maintain common structure for code when running multi cycle or single cycle.

Historically, substitute behaviors (BEH) were sometimes used to replace the blocks when the IO blocks were not yet available, or when it was desirable to have a simpler and faster logical representation. These were advantageous for a hardware accelerator where a C++ solution is impractical due to performance implications. Although these behaviors could be applied to the double data rate I/O blocks, absence of the present invention precludes the use of said I/O blocks with the interconnecting bus in a single cycle clocking mode since more data cannot be transferred across the bus in one cycle than its width allows.

The preferred embodiment contemplates FACDDR (80) for use with double data rate interfaces. However, one skilled in the art can appreciate how the present invention could be extended to interfaces where the information on the bus is passed at even higher frequency ratios relative to the source and destination registers in the logic elements. It should also be possible to create a hardware design language description of FACDDR that can be merged into the design model during a pre-process stage of the model build without requiring any changes to the base logic under test. Such a model would provide an extra path to carry the additional information per cycle that would be sent on the bus in a subsequent cycle when running in the single cycle clocking mode.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

APPENDIX A

API Functions Available in FACDDR Object: (Most Common, Public Functions)
Constructors/Destructors:

```
ScFacDDR( );
ScFacDDR( const RndFac &src );
ScFacDDR( const ScFacDDR &src );
ScFacDDR( int fac_clock, const string &name,
    UINT32 expected_num_rows, UINT32 expected_num_bits,
    TYPE expected_type, bool no_l112alias = false,
    bool allow_virtual = false, bool do_shape = false );
~ScFacDDR( );
```

Execution:

```
void shiftStagedData( );
void propagateStagedData( UINT32 start_pos=0, UINT32 ab_select=3 );
void initialize( UINT32 ab_select=3 );
```

Setup:

```
void setDDRBusClock( int bus_clock );
void setDDRLocalClock( int lcl_clock );
void setDDRLocalHalfClock( int lcl_half_clock );
bool addDest( UINT32 src_sb, UINT32 src_eb, UINT32 snk1_sb, UINT32 snk1_eb,
    UINT32 snk2_sb, UINT32 snk2_eb, const RndFac *snk1,
    const RndFac *snk2, bool bidi = false,
    int inSnk1ClockSection=-1, int inSnk2ClockSection=-1,
    const RndFac *snk1_t1=0, const RndFac *snk2_t1=0,
    const RndFac *snk1_tr=0, const RndFac *snk2_tr=0 );
bool addSrc( UINT32 snk_sb, UINT32 snk_eb, UINT32 src1_sb, UINT32 src1_eb,
    UINT32 src2_sb, UINT32 src2_eb, const RndFac *src1,
    const RndFac *src2, bool bidi = false,
    int inSrc1ClockSection=-1, int inSrc2ClockSection=-1 );
void setOutputDriverDelay( UINT32 delay_val=1, UINT32 ab_select=3 ); // defau
void setWireDelay( UINT32 delay_val=0, UINT32 ab_select=3 );         // defau
void setElasticDelay( UINT32 delay_val=1, UINT32 ab_select=3 );      // defau
void setReceiveLatchDelay( UINT32 delay_val=1, UINT32 ab_select=3 ); // defau
void setTargetCycleDelay( UINT32 delay_val=2, UINT32 ab_select=3 );  // defau
void updateTotalDelay( );
// Use these functions when it is necessary to change any delay settings
// after they have been set once.
void resetOutputDriverDelayLock( UINT32 ab_select=3 ); // default 1 on A and
void resetWireDelayLock( UINT32 ab_select=3 );         // default 0 on A and
void resetElasticDelayLock( UINT32 ab_select=3 );      // default 1 on A and
void resetReceiveLatchDelayLock( UINT32 ab_select=3 ); // default 1 on A and
void resetTargetCycleDelayLock( UINT32 ab_select=3 );  // default 1 on A and
void resetAllDelayLocks( );
void setInitialSetDone( )
void resetInitialSetDone( )
void disableDDRAction( )
void enableDDRAction( )
void setMoveUdDataToWire( bool inVal = true )
void setMoveWireDataToUr( bool inVal = true )
```

-continued

```
void setCaptureDataFromWire( bool inVal = true )
void setDriveOffCycle( bool inVal = true )
```

Access Functions:

A number of functions are provided to access current settings within the FACDDR

Runtime access for get/put:

```
void doPutDDR( UINT32 ab_select = 0x3 ) const;
BYTE *getCurPutDataDDRA( ) const
UINT32 *getCurPutDataIntDDRA( ) const
BYTE *getCurPutDataDDRB( ) const
UINT32 *getCurPutDataIntDDRB( ) const
BYTE *getOldPutDataDDRA( ) const
UINT32 *getOldPutDataIntDDRA( ) const
BYTE *getOldPutDataDDRB( ) const
UINT32 *getOldPutDataIntDDRB( ) const
BYTE *getCurPutURDataDDRA( UINT32 early_offset = 0 ) const
UINT32 *getCurPutURDataIntDDRA( UINT32 early_offset = 0 ) const
BYTE *getCurPutURDataDDRB( UINT32 early_offset = 0 ) const
UINT32 *getCurPutURDataIntDDRB( UINT32 early_offset = 0 ) const
```

FACDDRDB Interface:

Constructor/Destructor:

```
ScFacDDRDB( );
virtual ~ScFacDDRDB( );
```

Execution:

```
bool runCend( );
bool runCbgn( );
```

Initialization/Setup:

```
bool loadIOCList( const string &ioc_list_name );
bool loadIOC( const string &ioc_name, int bus_clock_id,
    int lcl_clock_id, int lcl_half_clock_id,
    const PinToNetSetList &p2n_list, bool allow_virt );
bool loadTNE( const string &tne_name, const string &instance,
    PinToNetSet *p2n );
bool disableLameDDRs( );
```

Add/Reference:

```
bool findFac( const ScFacDDR *&fac_ptr, const char *f_name,
    bool print_on_fail = true, bool allow_direct_netname = true );
bool set( const string &id, const ScFacDDR &src );
```

What is claimed is:

1. A software entity embodied in non-transitory tangible media for use with a digital design simulation model, comprising:
   linkages for standard logic elements for abstracting one or more design interface components out of a cycle simulation environment constructed with a cycle stimulation model in which all design source components are compiled into 1-Cycle CDUs, all design source components are compiled into 2-Cycle CDUs, or design source components are compiled into a combination of 1-Cycle and 2-Cycle CDUs, and
   wherein is included a merge and build step wherein said combination of 1-Cycle and 2-Cycle CDUs are incorporated into a flattened cycle simulation model comprised of internal data structures representing low level primitive blocks thereby producing a cycle simulation model containing a mixture of 1-Cycle and 2-Cycle CDU representation of design component source,
   design interface emulation of interface which:
   (a) interacts with a hybrid cycle simulation model through the use of an API to extract the present value of the signals at the driving side of an interface, and
   (b) sets facilities within said hybrid cycle simulation model on the receiving side of the interface, and
   wherein said software entity's control data and control code consists of information about delays, the mode that determines what facility accesses and alterations should be performed by the software entity, and a description of which bits of which wires and registers should be connected via an Application Program Interface for manipulating and accessing data pointers which represent a plurality of driver registers, receiver registers and bus interfaces, and further provides one propagation delay to the first part of a data transfer corresponding to a first clock edge and a same or different propagation delay to a second part of a data transfer corresponding to a second clock edge for use in a double data rate interface.

2. The software entity according to claim 1 wherein said software entity permits said present value to be transferred from the driving side to the receiving side using the precise cycle propagation delay as dictated by design specification.

3. The software entity according to claim 1 including optionally setting the bus interface simulation facilities between the driving and receiving sides of the interface,
   and further permitting said values to be transferred from the driving side to the receiving side using the precise cycle propagation delay as dictated by the design specification.

4. The software entity according to claim 1 wherein said software entity may optionally emulate the boundary driving and receiving registers on both sides of an interface for situations when the interface logic is not available for incorporation into the verification model.

5. The software entity according to claim 1 wherein the software entity interacts directly with actual driving and receiving boundary registers in cases where the actual interface logic is incorporated into a simulation model.

6. The software entity according to claim 1 wherein said software entity provides an Application Program Interface (API) to permit a plurality of simulation environments to utilize the software entity to interact with the underlying design components or with any software elements employed to represent one or more of said interface components for purposes of imparting and/or monitoring the transfer of data packets across an interface using prescribed interface propagation delay as defined by a design interface protocol.

7. The software entity according to claim 1 wherein the software entity provides virtual facilities to substitute for the boundary driver and receiver registers to manipulate and/or monitor an interface when said driver and receiver logic has not yet been incorporated into the verification model and wherein said virtual facilities can be optionally used or ignored at which time the logic design becomes available for use in said verification model.

* * * * *